United States Patent
Lok et al.

(10) Patent No.: US 11,146,282 B1
(45) Date of Patent: Oct. 12, 2021

(54) CALIBRATION OF RESIDUAL ERRORS USING LEAST-MEAN-SQUARES (LMS) AND STOCHASTIC-GRADIENT METHODS FOR AN ANALOG-TO-DIGITAL CONVERTER (ADC) WITH A PRE-CALIBRATED LOOKUP TABLE

(71) Applicant: Caelus Technologies Limited, Hong Kong (HK)

(72) Inventors: Chi Fung Lok, Hong Kong (HK); Xiaoyong He, Hong Kong (HK); Zhi Jun Li, Guangzhou (CN)

(73) Assignee: Caelus Technologies Limited, Hong Kong (HK)

( * ) Notice: Subject to any disclaimer, the term of this patent is extended or adjusted under 35 U.S.C. 154(b) by 0 days.

(21) Appl. No.: 17/140,683

(22) Filed: Jan. 4, 2021

(51) Int. Cl.
| | |
|---|---|
| *H03M 1/10* | (2006.01) |
| *H03M 1/46* | (2006.01) |
| *G06F 7/544* | (2006.01) |
| *H03M 1/68* | (2006.01) |

(52) U.S. Cl.
CPC ......... *H03M 1/462* (2013.01); *G06F 7/5443* (2013.01); *H03M 1/1019* (2013.01); *H03M 1/466* (2013.01); *H03M 1/68* (2013.01)

(58) Field of Classification Search
CPC ...... H03M 1/1047; H03M 1/468; H03M 1/00; H03M 1/06; H03M 1/0658; H03M 1/069; H03M 1/0692; H03M 1/10; H03M 1/1038; H03M 1/1042; H03M 1/1052; H03M 1/1071; H03M 1/12; H03M 1/167; H03M 1/462; H03M 1/66; H03M 1/804; H03M 3/424

USPC ................. 341/118–120, 155, 161, 162, 172
See application file for complete search history.

(56) References Cited

U.S. PATENT DOCUMENTS

| | | | |
|---|---|---|---|
| 7,348,906 B2 | 3/2008 | O'Donnell et al. | |
| 8,164,495 B2 | 4/2012 | Agi | |
| 8,223,044 B2 | 7/2012 | Snedeker | |

(Continued)

OTHER PUBLICATIONS

Wenbo Liu et al., "A 12 b 22.5/45 MS/s 3.0 mW 0.059 mm2 CMOS SAR ADC achieving over 90 dB SFDR", IEEE ISSCC Dig. Tech Papers, pp. 380-381, Feb. 2010.

(Continued)

*Primary Examiner* — Linh V Nguyen
(74) *Attorney, Agent, or Firm* — Stuart T. Auvinen; gPatent LLC

(57) ABSTRACT

A first calibration measures capacitor array mis-match and updates a Look-Up Table (LUT) with calibrated weights that are copied to both a positive LUT and a negative LUT, and then adjusted for non-linearity errors by a second calibration using a Least Mean-Square (LMS) method. The binary code in the Successive-Approximation Register (SAR) is complemented to generate a complement code with a sign bit. When the sign bit is positive, entries for complement code bits=1 are read from the positive LUT and summed, a first offset added, and the sum normalized to get a corrected code. When the sign bit is negative, entries for complement code bits=0 are read from the negative LUT and summed, a second offset added, and the sum normalized to get the corrected code. A Multi-Variable Stochastic Gradient Descent method generates polynomial coefficients that further correct the corrected code.

20 Claims, 19 Drawing Sheets

(56) References Cited

U.S. PATENT DOCUMENTS

| | | | | |
|---|---|---|---|---|
| 9,041,569 | B2* | 5/2015 | Zhou | H03M 1/0617 |
| | | | | 341/118 |
| 9,154,152 | B1* | 10/2015 | Chiu | H03M 1/0607 |
| 9,397,679 | B1* | 7/2016 | Harpe | H03M 1/38 |
| 9,985,640 | B1* | 5/2018 | Wen | H03M 1/1038 |
| 10,483,995 | B1* | 11/2019 | Lok | H03M 1/1038 |
| 2011/0260899 | A1* | 10/2011 | Snedeker | H03M 1/1047 |
| | | | | 341/118 |
| 2013/0002467 | A1* | 1/2013 | Wang | H03M 1/145 |
| | | | | 341/172 |
| 2016/0352347 | A1* | 12/2016 | Fernando | H03M 1/1009 |
| 2017/0093414 | A1* | 3/2017 | Sun | H03M 1/38 |
| 2018/0219558 | A1* | 8/2018 | Chiu | H03M 1/804 |

OTHER PUBLICATIONS

Hongxing Li et al., "A Signal-Independent Background-Calibrating 20b 1MS/s SAR ADC with 0.3ppm INL", IEEE ISSCC Dig. Tech Papers, pp. 242-244, Feb. 2018.

John A. NcNeill et al., "All-Digital Background Calibration of a SAR ADC Using the Split ADC Architecture", IEEE TCAS I, vol. 58, No. 10, Oct. 2011.

\* cited by examiner

CALIBRATION OF RESIDUAL ERRORS USING LEAST-MEAN-SQUARES (LMS) AND STOCHASTIC-GRADIENT METHODS FOR AN ANALOG-TO-DIGITAL CONVERTER (ADC) WITH A PRE-CALIBRATED LOOKUP TABLE

FIELD OF THE INVENTION

This invention relates to Analog-to-Digital Converters (ADCs), and more particularly to additional all-digital calibration of an ADC after the Look-up table has already been calibrated.

BACKGROUND OF THE INVENTION

Accuracy of an Analog-to-Digital Converter (ADC) is quite important. Conversion errors can be non-linear and difficult to correct.

FIG. 1 shows a prior-art ADC. Comparator 12 compares its + and − input voltages to generate a comparator output voltage VCOMP. An upper array of capacitors 14, 17, 18 is connected to the + input, while an identical lower array of capacitors 14, 16, 19 is connected to the − input. The capacitors may be binary-weighted or may have other weightings. In this example, the capacitor weights are 1, 1, 2, 3, 5, 10, 17, and 32 times a minimum or unit capacitance value C of a smallest capacitor.

Actual fabricated circuits have variations in sizes of capacitors 14, 16-19 that may cause errors during data conversion. For example, the capacitors may vary by +/−1%. For the smaller or Least-Significant-Bit (LSB) capacitors 14, the impact of this variation is relatively small and produces a tolerable error in the final conversion result. However, for the Most-Significant-Bit (MSB) capacitors 16-19, this 1% size variation can cause a larger linearity error in the final result.

For example, capacitor 17 has a nominal value of 17 C, but may have an actual value of 17.12 C. Although this 0.12 C error is within the 1% tolerance, 0.12 C is 12% of the LSB capacitance of 1 C.

Calibration may be used to measure the actual capacitances of MSB capacitors 16-19 to compensate for these linearity errors. It can be assumed that LSB capacitors 14 have ideal weights or sufficient accuracy for the application. During a calibration routine, a Successive-Approximation Register (SAR) applies a sequence of signals to LSB capacitors 14 and VCOMP is examined to see if the SAR setting applied to LSB capacitors 14 produces a higher or lower total capacitance (and voltage swing) than capacitor 17. A reference voltage VREF is applied to capacitor 17 while lower 17 C capacitor 16 is grounded. A common-mode voltage VCM such as VREF/2 is applied to both MSB capacitors 18, 19 to ignore this pair. The SAR register drives each pair of LSB capacitors 14 to 0 by applying VREF to the lower capacitor 14 and ground to the upper capacitor 14 of that pair (if VCOMP is logic 1 for this trial), or return to VCM for a 0 state. The SAR settings are tested until a closest match is found. The final SAR setting can be multiplied by the nominal capacitances of the LSB capacitors 14 that are set to 1 and summed to obtain the measured value of 17 C formed by capacitors 17, 16.

FIG. 2A shows a calibration sequence with little error. The SAR or other logic initially drives all capacitors 14, 18, 19 to VCM while VREF is applied to 17 C capacitor 17 and ground to 17 C capacitor 16. Since only 17 C capacitor 17 is charged, a differential voltage proportional to the +17.12

C value of 17 C formed by capacitors 16, 17 is measured by comparator 12. Note that the voltages shown in FIGS. 2A-2B are idealized voltages, such as a voltage in μV when the unit capacitance C is 1 fF.

Next, the SAR drives the 10 C capacitor pair 14 low by driving ground and VREF to the upper and lower 10 C capacitors 14. This subtracts a differential voltage proportional to 10 C. The resulting voltage +7.12 is greater than 0, so the 10 C bit is set to 1 in the SAR.

Next, the SAR drives the 5 C capacitor pair 14 low by driving ground and VREF to the upper and lower 5 C capacitors 14. This subtracts a differential voltage proportional to 5 C. The resulting voltage +2.12 is greater than 0, so the 5 C bit is set to 1 in the SAR.

Next, the SAR drives the 3 C capacitor pair 14 low by driving ground and VREF to the upper and lower 3 C capacitors 14. This subtracts a differential voltage proportional to 3 C. The resulting voltage −0.88 is less than 0, so the 3 C bit is set to 0 in the SAR. The SAR drives the 3 C capacitor pair to the common-mode voltage, (VCM, VCM), since VCOMP went below zero and too much was subtracted. This takes the voltage back up to +2.12.

Then the SAR drives the 2 C capacitor pair 14 low by driving ground and VREF to the upper and lower 2 C capacitors 14. This subtracts a differential voltage proportional to 2 C, or +2.12−2=+0.12. The resulting voltage +0.12 is greater than 0, so the 2 C bit is set to 1 in the SAR.

Finally, the SAR drives the 1 C capacitor pair 14 low by driving ground and VREF to the upper and lower 1 C capacitors 14. This subtracts a differential voltage proportional to 1 C. The resulting voltage −0.88 is less than 0, so the 1 C bit is set to 0 in the SAR.

The final digital code in the SAR at the end of the calibration sequence is 11010. The weights of LSB capacitors 14 are multiplied by this digital code and summed to obtain the measured value:

$$1\times10C+1\times5C+0\times3C+1\times2C+0\times1C=17C.$$

FIG. 2B shows a calibration sequence with a significant error. For larger ADC's with more significant bits, the error may be greater than the LSB. In the example of FIG. 2B, an error of −2.0 occurs when the 2 C bit is being evaluated during the calibration routine. In FIG. 2A, the idealized voltage read when testing the 2 C pair of LSB capacitors 14 is +0.12, but when the −2.0 noise is added the measured voltage by comparator 12 is −1.88 as shown in FIG. 2B.

Since the resulting voltage −1.88 is less than 0, the 2 C bit is set to 0 in the SAR. The SAR drives the 2 C capacitor pair to the common-mode voltage, (VCM, VCM), since VCOMP went below zero and too much was subtracted. This takes the voltage back up to +2.12.

Finally, the SAR drives the 1 C capacitor pair 14 low by driving ground and VREF to the upper and lower 1 C capacitors 14. This subtracts a voltage proportional to 1 C. The resulting voltage +2.12−1=+1.12 is greater than 0, so the 1 C bit is set to 1 in the SAR.

The final digital code in the SAR at the end of the calibration sequence with noise is 11001. The weights of LSB capacitors 14 are multiplied by this digital code and summed to obtain the measured value:

$$1\times10C+1\times5C+0\times3C+0\times2C+1\times1C=16C.$$

The error caused the measurement to be off by more than one significant bit, as 16 C is more that 1.00 less than the actual value of 17.12 in this example. Even worse, this error can accumulate to other MSB's when they are later calibrated using the erroneous value for 17 C formed by capacitors 16, 17.

FIG. 3 is a plot of the spectral density of an ADC before calibration. The decibels relative to full scale (dBFS) of the Power Spectral Density (PSD) is plotted from a Fast Fourier Transformer (FFT) of a simulation of a typical ADC before calibration. Capacitor mismatch causes spurs 302 in the spectrum. These spurs 302 are undesirable. Calibration can improve the plot and reduce the size of spurs 302 when the noise is less than a significant bit, but when the noise is greater than the LSB, spurs 302 can remain even after calibration. Many calibration methods limit ADC accuracy or conversion rate, require special input signals such as sine or triangular waves, are complex and require a large chip area and power, with a higher manufacturing cost. Calibration accuracy is often susceptible to system noise.

FIG. 4 shows an ADC with a calibrated Look-Up Table (LUT) that stores the actual radixes that include the errors measured during LUT calibration. LUT calibration is performed for each MSB capacitor pair 18, 19 . . . to generate the ideal radix R[X] and the measured error E[X] for each MSB capacitor.

Calibration sequencer 108 calculates the actual measured radix A[X], which is the sum of the ideal radix R[X] and the measured error E[X]. Then the actual measured radix A[X] is stored in LUT 111. During initialization, LUT 111 can be loaded with the ideal radixes that are calculated from the capacitor sizes and any attenuation factors. Then later the ideal radixes are replaced by the actual measured radix A[X] values as they are generated during LUT calibration (radix error calibration).

After LUT calibration, during normal ADC conversions, an analog input voltage is applied to capacitor array 121 and calibration sequencer 108 controls SAR 104 to apply test voltages to LSB capacitors 14 and MSB capacitors 18, 19 during SAR searches. The final SAR code D[7:1] is used to lookup actual radixes in LUT 111 that include the measured errors. These actual radixes were previously loaded into the LUT during LUT calibration. Adder 118 in error corrector 110 sums the actual radixes for all bits set to 1 in final SAR code D[7:1] to obtain the radix-corrected digital code DC.

Since LUT calibration does not eliminate all errors, some post-LUT error processing may occur. For example, digital adder 122 can subtract a Digital Offset (DOS) code stored in DOS code register 120 from the radix-corrected digital code DC obtained from LUT 111. The difference from digital adder 122 can be scaled by multiplier 126 with a gain factor DG to normalize the result to generate the final digital code result DC'. Gain correction calculator 130 generates gain factor DG by dividing the desired range of results by the sum of the ideal radixes and measured errors.

While LUT calibration is effective in reducing errors caused by capacitor mismatch, other error sources are present. Analog input buffer 13 receives an analog input voltage and drives an analog signal onto capacitors 14, 18, 19 . . . in capacitor array 121. However, analog input buffer 13 may not be exactly precise or linear and may introduce non-linearity errors that are not corrected by LUT calibration. When the control signals from calibration sequencer 108 switch capacitors on and off in capacitor array 121, some switching noise may also cause errors. The supply current may vary as capacitors are charged and discharged as switches open and close in capacitor array 121. Capacitors may have a voltage dependance due to process variations.

Analog input buffer 13, capacitor voltage dependence, signal dependent references, and other factors may contribute to non-linearity errors that result in Integral Non-Linearity (INL) and Total Harmonic Distortion (THD). These non-linearity errors may not be fully compensated for by LUT calibration.

What is desired is a high-resolution ADC or Digital-to-Analog Converter (DAC) with good linearity so that the digital output closely follows the analog input, or vice-versa. It is desired to remove errors that remain in the LUT after LUT calibration has removed capacitor mis-match errors. It is desired to provide another layer of calibration after LUT calibration is completed. More accurate calibration of an ADC is desirable.

DETAILED DESCRIPTION

The present invention relates to an improvement in ADC post-LUT digital calibration. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 5:
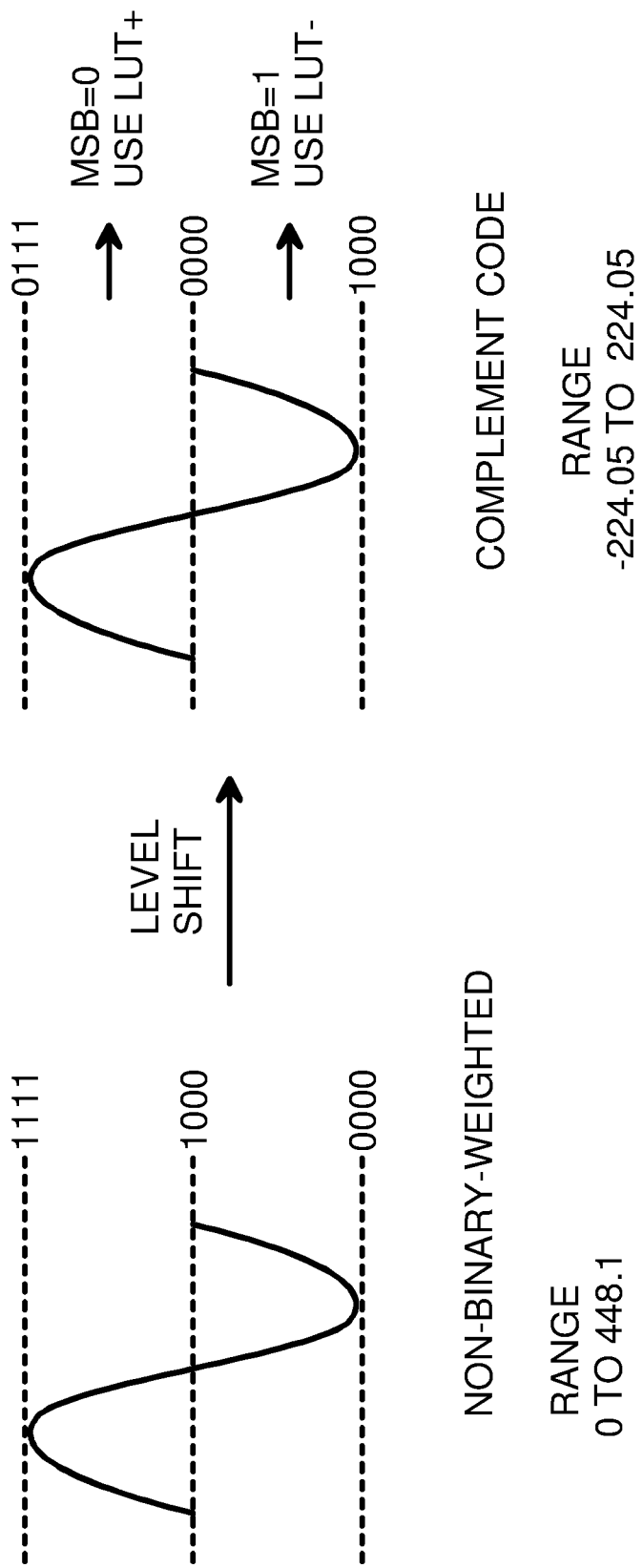
FIG. 5 shows level shifting.

FIG. 5 shows level shifting. The inventors have realized that one source of non-linearity errors is the asymmetric mismatch on positive code (from 1000 . . . 0 to 1111 . . . 1) and negative code (from 0000 . . . 0 to 0111 . . . 1). This is mostly contributed by the front-end analog buffer, especially in a single-ended configuration. Non-linearity errors appear as harmonics on the spectrum or parabolic shape on code INL. Even-order harmonics such as HD2, HD4, etc. are caused by code asymmetries around the mid-point, a finite Common Mode Rejection Ratio (CMRR) of the ADC, and distortion from the analog input buffer. Odd-order harmonics such as HD3, HD5, etc. are caused by sampling distortion on the switched capacitor network, signal-dependent reference voltage and capacitor voltage dependency so that the code structure is an odd asymmetric function on code INL. For a fully differential circuit, this is the most dominant error source of nonlinearity of the ADC. Nevertheless, both finite HD2 and HD3 restrict the linearity performance of an ADC which appear as harmonics in the spectrum or a parabolic shape on code INL. The inventors resolve such a residual nonlinearity error that a prior-art LUT to correct capacitor mismatch does not fully resolve.

The inventors solve this problem by level shifting the binary code before lookup in the LUT. Binary code is converted to a complement code, similar to two's complement but for a non-binary code structure. The mid-point code value is set to 0000, with the maximum as 0111 and the minimum as 1000.

The LUT is duplicated to form 2 LUT's, called LUT+ and LUT−. LUT+ is accessed by positive code values, which have the MSB=0 for the complement code, while LUT− is accessed by negative code values, which have MSB=1.

The higher Common-Mode Rejection Ratio (CMRR) of using two LUT's enhances even symmetry and reduces even harmonic spurs such as HD2. The positive and negative complement code structure is applied to two slightly different LUT's, LUT+ and LUT−. An LMS search modifies entries in LUT+ and LUT− to minimize errors. An offset is added to adjust the common mode code for LUT+ and LUT−. This enhances the even symmetry of the complement code and hence reduces the even harmonic distortion compared with having only a single LUT.

The calibrated actual values stored in LUT 111 (FIG. 4) are copied into LUT+ and into LUT−. So both LUT+ and LUT− have the same calibrated values. Additional or secondary calibration, described later, adjusts these LUT entries so that different values are stored in LUT+, LUT− once secondary calibration is completed.

Figure 6:
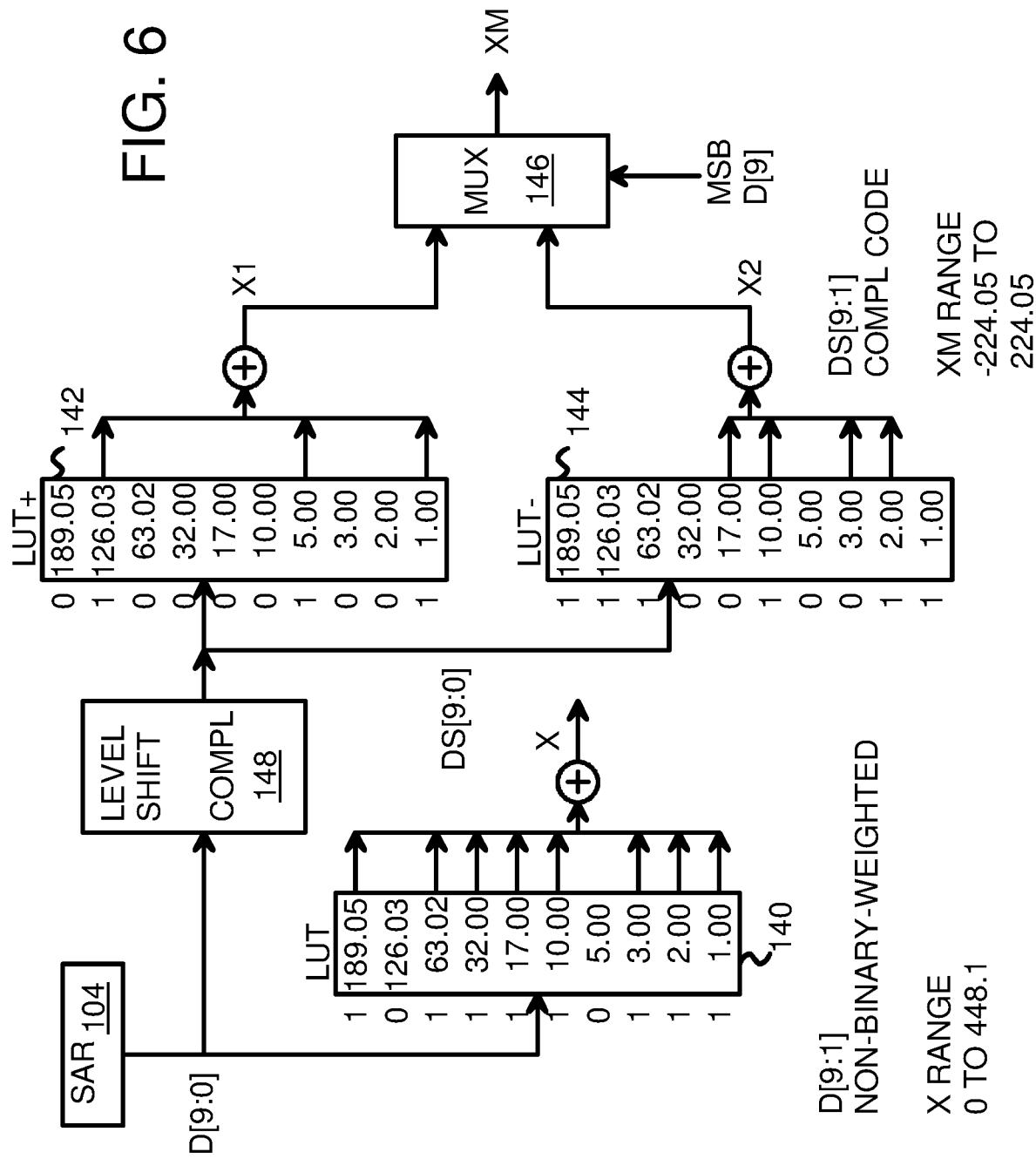
FIG. 6 shows duplicated LUT's accessed by a non-binary-weighted complement code.

The binary range is from 0 to the sum of all LUT entries, such as 0 to 448.1 for the LUT 140 entries shown in FIG. 6. When level-shifted to complement code, the range is from −224.05 to +224.05, for the same LUT 140 entry values.

FIG. 6 shows duplicated LUT's accessed by a non-binary-weighted complement code. After LUT calibration, LUT 140 is loaded with actual radix values for each capacitor size in capacitor array 121. In this example, only the 3 MSB's are calibrated, with values of 189.05, 126.03, and 63.02, while less-significant capacitor values are stored as ideal radixes in LUT 140, such as 32, 17, etc., with decimal or fractional values of zero.

Without secondary calibration, LUT 140 could be used to provide a LUT− calibrated data conversion result X. During data conversion, after the search of capacitor array 121 is completed, SAR 104 is loaded with a 10-bit digital value D[9:0] that represents the analog input. Each bit in D[9:0] that is a 1 causes the corresponding entry in LUT 140 to be read and added together to generate X. For example, when D[9:0] is 1011110111, the entries with 1 bits are selected, with entry values of 189.05, 63.02, 32.00, 17.00, 10.00, 3.00, 2.00, and 1.00, which are added together to get 317.07, which is X.

With secondary calibration, the entry values in LUT 140 are copied into LUT+ 142 and LUT− 144. The entry values in LUT+ 142 and LUT− 144 can late be adjusted by secondary calibration, but are shown in FIG. 6 before any adjustments.

Figure 18:
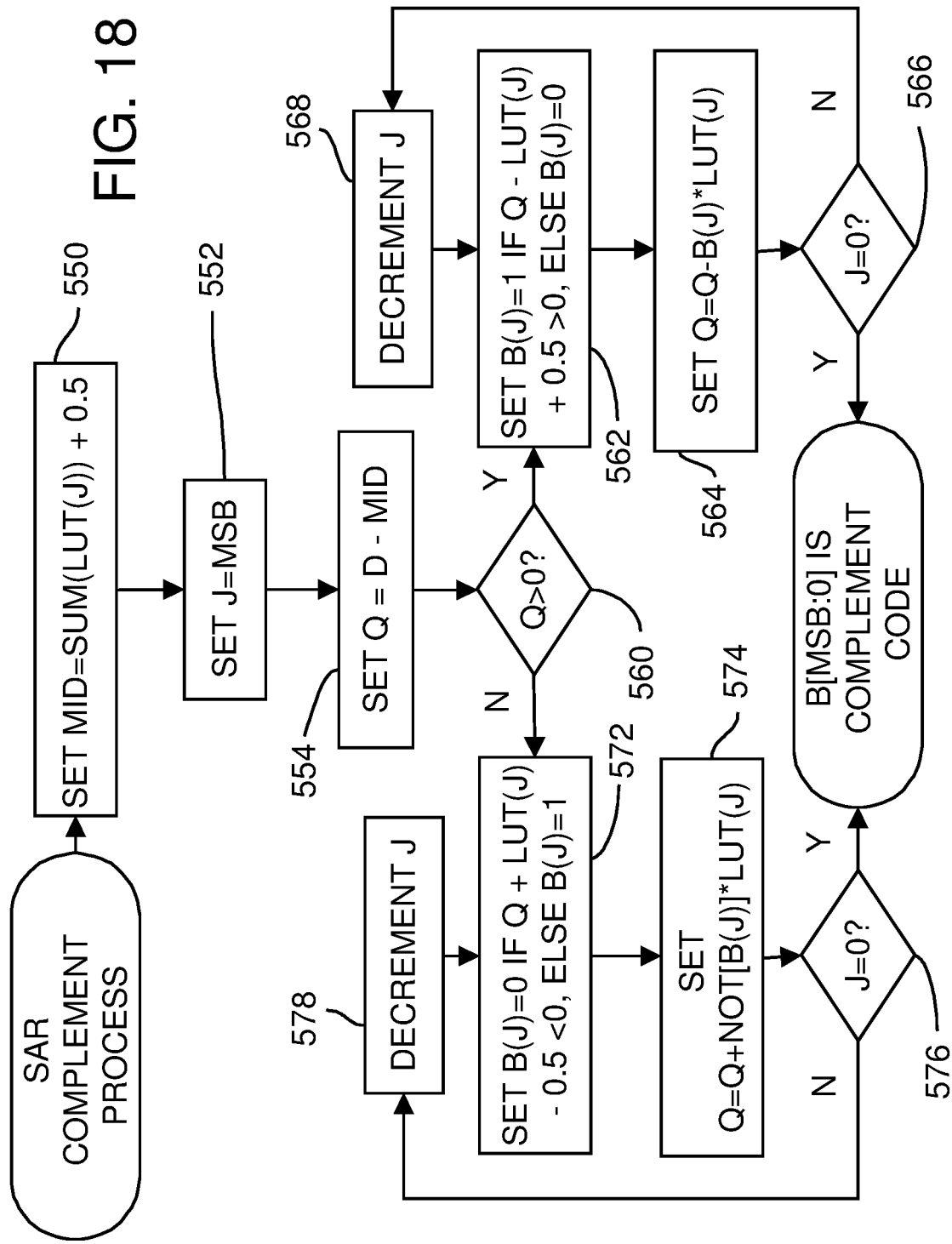
FIG. 18 is a flowchart of a non-binary code complementor.

Code complementor 148 acts as a digital level shifter to convert the non-binary-weighted values of D[9:0] to complement code of DS[9:0]. A Successive-Approximation or SAR search is used to generate the complement code using the capacitor weights. The complement code is a capacitor-weighted complement code. FIG. 18 shows the complement process in more detail for the non-binary weighted code.

For example, the weighted complement code of 1101001101 is 0100001001. Entries in LUT+ 142 having a corresponding DS[9:0] bit of 1 are selected, read, and summed, while entries in LUT+ 142 having a corresponding DS[9:0] bit of 0 are ignored.

Entry values of 126.03, 5.00 and 1.00 are read from LUT+ 142 and summed to get 132.03 as X1. Since the binary MSB D[9] is 1, mux 146 selects the top input from LUT+ 142 to output as XM.

Note that the binary and complement code MSB's are opposite, so LUT+ 142 is access when MSB D[9] is 1 and MSB DS[9] is 0.

In another example, the capacitor-weighted digital code D[9:0] is 0101001101, so complementor 148 outputs 1110010011 as the complement code DS[9:0]. Entries in LUT− 144 having a corresponding DS[9:0] bit of 0 are selected, read, and summed, while entries in LUT− 144 having a corresponding DS[9:0] bit of 1 are ignored.

Entry values of 32.00, 17.00, 5.00 and 3.00 are read from LUT+ 142 and summed to get 57.00. However, the entries in LUT− 144 refer to negative numbers, so the sum is a negative number, so −57.00 is output as X2. Since the binary MSB D[9] is 0, mux 146 selects the bottom input from LUT− 144 to output as XM.

Figure 4:
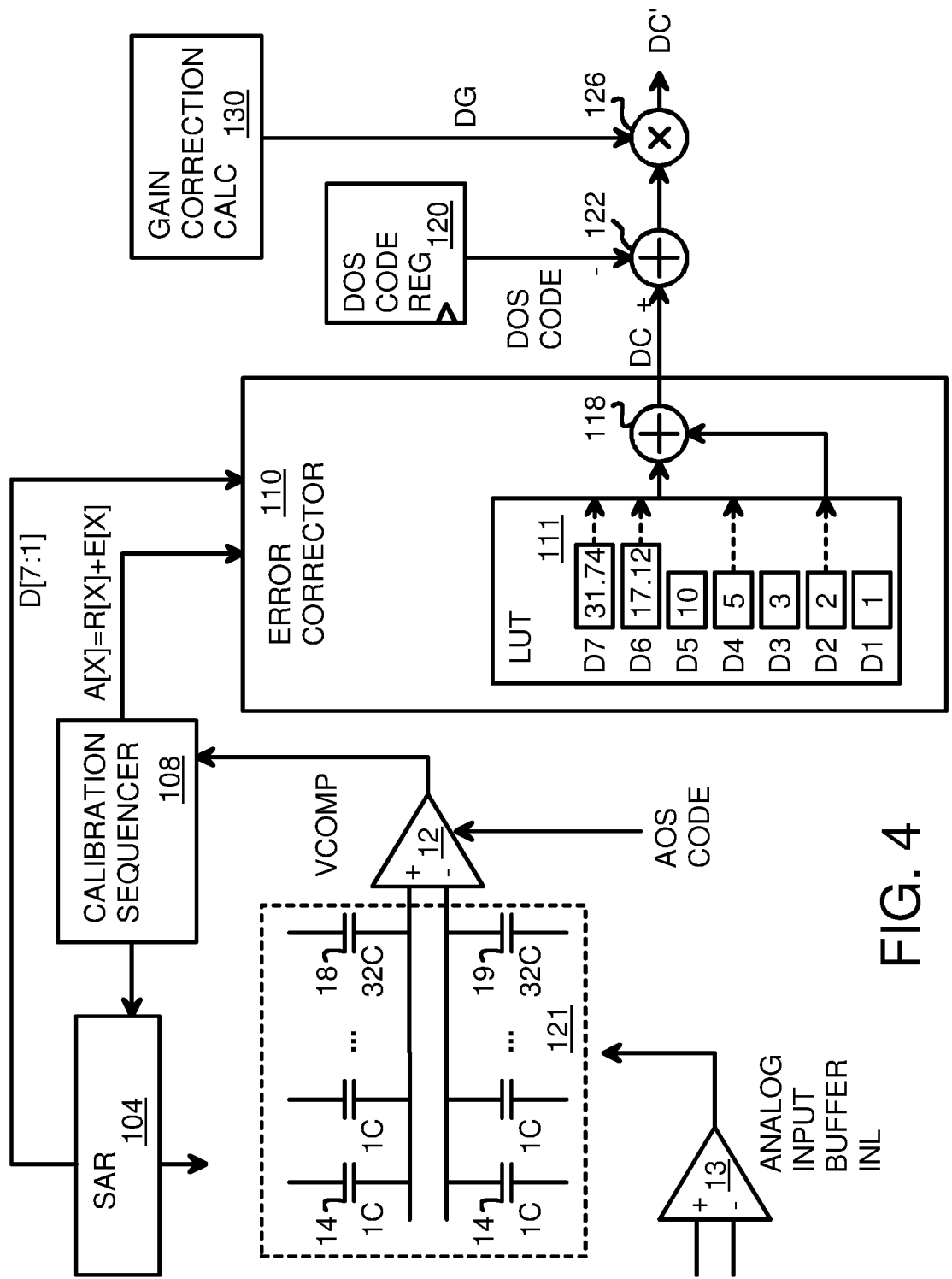
FIG. 4 shows an ADC with a calibrated Look-Up Table (LUT) that stores the actual radixes that include the errors measured during LUT calibration.
Figure 7:
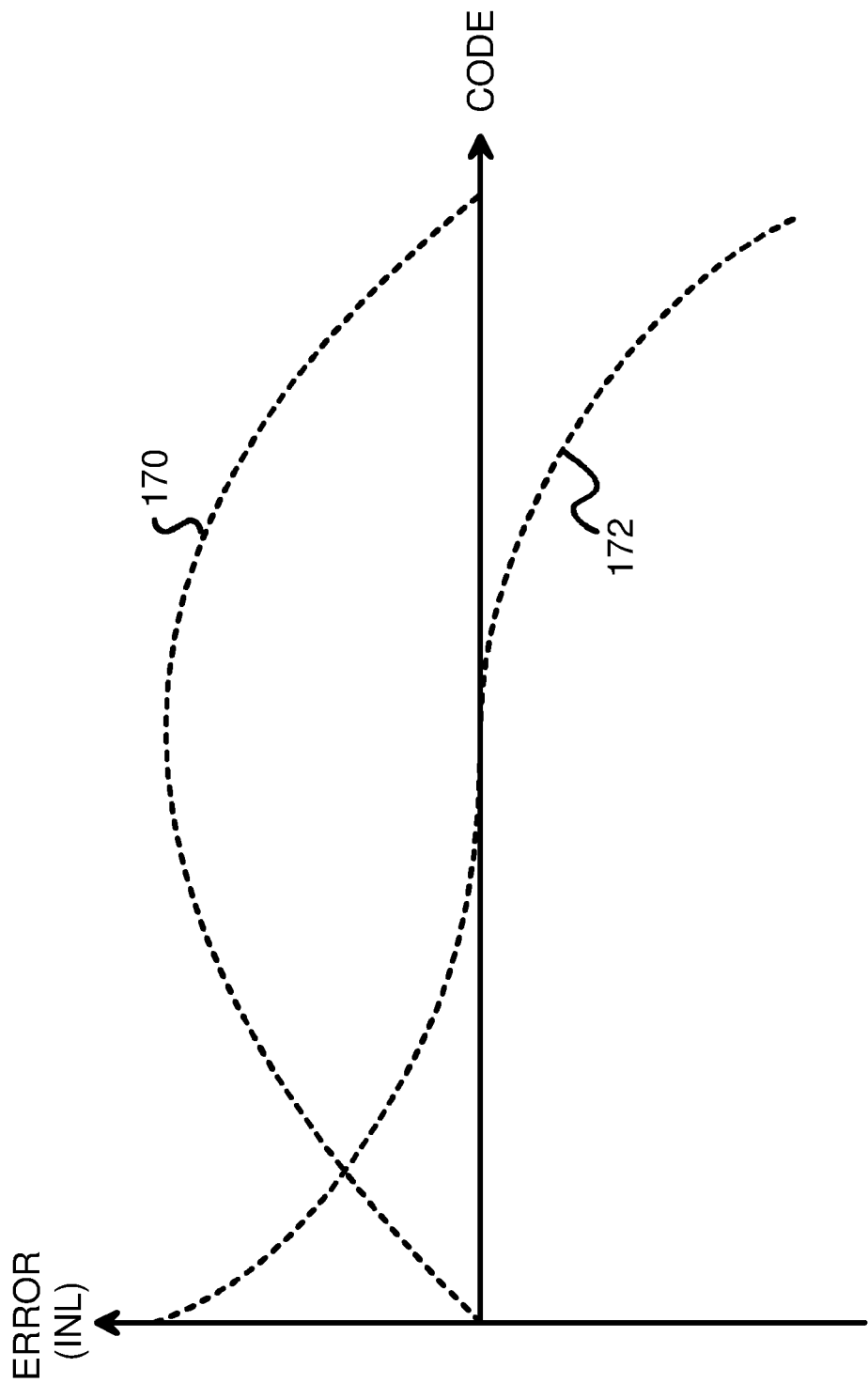
FIG. 7 is a graph of curvature non-linear error.

FIG. 7 is a graph of curvature non-linear error. INL is plotted as a function of the digital code generated from a calibrated LUT, such as DC' of FIG. 4. INL represents the remaining errors after capacitor size mismatch errors are corrected for by LUT calibration. The calibrated actual values in the LUT still contain other errors, such as those errors caused by analog input buffer 13 (FIG. 4). Additional post-processing after LUT 111, such as by adding an offset such as a DOS code and multiplying by a gain correction factor DG, can improve the offset and gain error, but cannot completely remove the non-linearity errors. Thus the final corrected code DC' still has some remaining errors.

The inventors model these remaining errors with a polynomial. The polynomial models the remaining errors as a series of curves that are added together. The most significant polynomial terms are the highest order, such as the second and third order. FIG. 7 shows only the second and third order curves; the fourth and higher order curves are not shown.

Second-order curve 170 models the remaining error as a second-order polynomial term such as $\beta_2 * x^2$, which is a curve with a maximum deviation near a mid point of the code. The amount of curvature of second-order curve 170 is determined by the coefficient $\beta_2$. The higher the curvature, the greater the non-linearity. A perfectly linear system would have a straight line at INL=0.

Third-order curve 172 models the remaining error as a third-order polynomial term such as $\beta_3 * x^3$, which is a curve with an inflexion near a mid point of the code. The amount of curvature is determined by the coefficient $\beta_3$.

Figure 8:
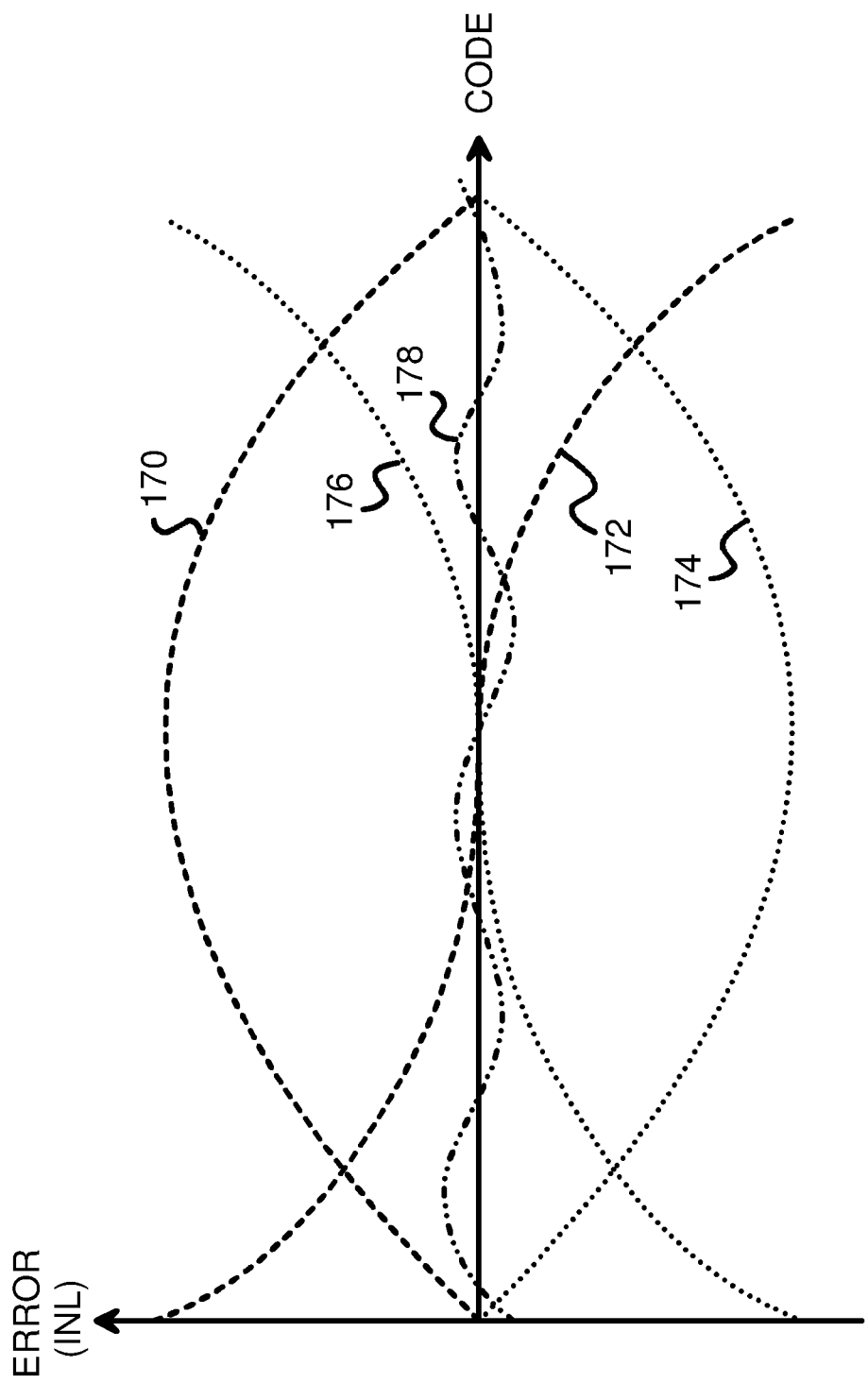
FIG. 8 is a graph showing subtraction of polynomial terms to reduce non-linearity error.

FIG. 8 is a graph showing subtraction of polynomial terms to reduce non-linearity error. The inventors' goal is to generate inverse second-order curve 174 that when added to second-order curve 170 results in a very small value for the remaining error. Likewise, the inventors' secondary calibration process attempts to generate inverse third-order curve 176, that when added to third-order curve 172 results in a very small remaining INL error curve 178. The inventors use a secondary calibration with a Stochastic Gradient Descend method and a Least Mean-Square (LMS) method to generate inverse second-order curve 174 and inverse third-order curve 176 as LMS-fitted curves.

Mathematical Support for Secondary Calibration Methods

In this section the mathematics supporting the secondary calibration methods are described in detail. First the Multi-Variable Stochastic Gradient Descent Method is described that generates the polynomial coefficients $\beta_0$, $\beta_1$, $\beta_2$, $\beta_3$, that are used for secondary data correction. Then the LMS Method for LUT Residual Errors is described that generates residual error values XE1 for adjusting the entries in LUT+ 142, residual error values XE2 for adjusting the entries in LUT- 144, offset OS1 that is added to the sums from LUT+ 142, and offset OS2 that is added to the sums from LUT- 144.

After these methods are used during secondary calibration, subsequent data conversion operations use coefficients $\beta_0$, $\beta_1$, $\beta_2$, $\beta_3$, OS1, OS2, and LUT+ 142 updated with XE1, and LUT- 144 updated with XE2.

Before secondary calibration is performed, a primary or LUT calibration is performed. LUT calibration populates LUT 111 with entries of actual calibrated capacitor weights that were found by the LUT calibration. Secondary calibration occurs after primary LUT calibration.

The LUT output DC, or the post-LUT error-corrected output DC' (FIG. 4) is the actual signal a. This actual signal a is digitally filtered to obtain a reference signal r. The digital filter can be a digital filter that removes harmonics, a Fast Fourier Transform (FFT) that removes harmonics, or another digital filter that recovers a fundamental signal (r) from an actual signal (a, DC, or DC'). Output signals a from two or more ADC's can also be compared or averaged to get r.

The actual signals a are considered to be a function of the polynomial coefficients $\beta$, but the ideal reference signal r is not a function of $\beta$. The actual signals a are filtered to generate reference signal r and to remove harmonics caused by these polynomial terms; thus r is considered to not be a function of $\beta$ while a is a function of $\beta$.

Multi-Variable Stochastic Gradient Descent Method

The inventors define C to be the curvature of the difference between r and a, or the square of the difference between the actual signal and the reference signal:

$$C = [r - a(\beta)]^2$$

This curvature represents non-linearity or distortion. The inventors desire to reduce this distortion to close to zero, so the inventors take the derivative of C with respect to $\beta$:

$$\frac{\partial C}{\partial \beta} = 2[r - a(\beta)]\left(\frac{\partial r}{\partial \beta} - \frac{\partial a}{\partial \beta}\right)$$

and set this derivative to zero to get eqn. (1):

$$\frac{\partial C}{\partial \beta} = -2[r - a(\beta)]\frac{\partial a}{\partial \beta} = 0$$

This equation represents the minimum error between r and a as a function of $\beta$. The actual signals a are obtained from the LUT as DC or DC', while the reference signals r are obtained by digitally filtering a, so both a and r are known and available. The unknown parameter is $\beta$, which can be searched for using LMS or a gradient descent method.

However, $\beta$ can be expanded to several coefficients $\beta_0$, $\beta_1$, $\beta_2$, ... $\beta_N$ for the polynomial terms when a is expanded to a Taylor series, and x is a normalized code, eqn. (2):

$$a = \beta_0 + \beta_1 x + \beta_2 x^2 + \beta_3 x^3 + \ldots$$

The coefficient $\beta_0$ can represent the offset error (OS), $\beta_1$ can represent the gain error (DG), $\beta_2$ can represent the second harmonics, $\beta_3$ can represent the third harmonics, and the fourth and higher harmonics can be ignored for calibration.

When the Taylor series, eqn. (2) is substituted into eqn. (1), a series of differential equations, eqns. (3), are obtained:

$$\partial C/\partial \beta_0 = -2[r - \beta_0 - \beta_1 x - \beta_2 x^2 - \beta_3 x^3 - \ldots]$$

$$\partial C/\partial \beta_1 = -2[r - \beta_0 - \beta_1 x - \beta_2 x^2 - \beta_3 x^3 - \ldots]x$$

$$\partial C/\partial \beta_n = -2[r - \beta_0 - \beta_1 x - \beta_2 x^2 - \beta_3 x^3 - \ldots]x^n$$

We can define w as a term that is common in all eqns. (3):

$$w = -2(r - a - \beta_0 - \beta_1 x - \beta_2 x^2 - \beta_3 x^3 - \ldots OS_{r,a})$$

Where $OSr_a$ is the average offset error difference $E(r-a)$.

Substituting for w into eqns. (3) and re-writing in matrix form produces eqn. (4):

$$\left[\frac{\partial C}{\partial \beta_0} \frac{\partial C}{\partial \beta_1} \frac{\partial C}{\partial \beta_2} \frac{\partial C}{\partial \beta_3} \cdots \frac{\partial C}{\partial \beta_n}\right] = w(1 \quad x \quad x^2 \quad x^3 \quad \ldots \quad x^n) = e$$

Where e is an error to be minimized. There are N derivative equations to be resolved by optimizing this N-dimensional-space convex function of eqn. (4).

$$= -2(r - a)\frac{\partial a}{\partial \beta} = 0$$

Equation eqn. (4) can be resolved using a multi-variable stochastic gradient descent method to obtain the coefficients $\beta_0$, $\beta_1$, $\beta_2$, $\beta_3$, etc. A series of update equations can be used to solve matrix eqn. (4) for coefficients $\beta_0$, $\beta_1$, $\beta_2$, $\beta_3$, etc., A different $\beta_t$ coefficient is updated for each of eqn. (5):

$$\beta_0(n+1) = \beta_0(n) - \mu_{\beta 0}\exp(-KT)\frac{\partial C}{\partial \beta_0}$$

$$\beta_1(n+1) = \beta_1(n) - \mu_{\beta 1}\exp(-KT)\frac{\partial C}{\partial \beta_1}$$

$$\beta_i(n+1) = \beta_i(n) - \mu_{\beta i}\exp(-KT)\frac{\partial C}{\partial \beta_i}$$

The derivative term at the end of each of eqns. (5) represents both the magnitude and direction of the offset error, while exp(-KT) is the adjustment rate of updates, and $\beta_\beta$ is the LMS update rate.

When the derivative is positive, the new $\beta_i$ (n+1) will be smaller to minimize an error of the derivative. Otherwise, the new $\beta_i$ (n+1) will be larger to suppress an error of the derivative. By means of large number of points, $\beta_i$ will be converged to a coefficient to be searched for, and the derivative will be driven to zero.

The above multi-variable gradient descent method obtains coefficients $\beta_0$, $\beta_1$, $\beta_2$, $\beta_3$, etc. These coefficients are the polynomial coefficients that determine the curvature of the errors, such as shown in FIG. 8 where $\beta_2$ generates inverse second-order curve 174 and 33 generates inverse third-order curve 176 to correct for errors between the reference signal r and the actual signal a from the pre-calibrated LUT.

LMS Method for LUT Residual Errors

However, there may still be other errors that are not compensated for by the polynomial, such as shown by remaining INL error curve 178 (FIG. 8). These remaining or residual errors may not be modeled well by higher-order polynomial coefficients such as $\beta_4$ and above. Instead, to avoid the complexity of a polynomial series implementation, the inventors use a Least Mean-Square (LMS) method to measure these residual errors to generate separate offsets OS1, OS2 that are applied to the sums read from LUT+ 142 and LUT− 144, respectively. Having different offset values for the positive and negative LUT's allows for more accurate offset correction than if the same offset value were applied to the full range of output values. In addition, all the entries in LUT+ 142 and LUT− 144 are updated to minimize the linear error. As such, the higher-order polynomial error can be reduced via LUT+ 142 and LUT− 144 instead of using a long series of polynomial coefficients $\beta_1$.

The pre-calibrated LUT entries have been adjusted for capacitor weight mismatch, but the same values are written into both LUT+ 142 and LUT− 144. The LMS method calculates these residual errors and updates the entries in LUT+ 142 and LUT− 144.

The residual errors are separately obtained for entries in each table. Error corrections XE1 for entries in LUT+ 142 can have different values than error corrections XE2 for entries in LUT− 144. A separate XE1 value is obtained for each entry in LUT+ 142, and a separate XE2 value is obtained for each entry in LUT− 144. The XE1 values are added to entries in LUT+ 142 to adjust those entries for residual errors, while the XE2 values are added to entries in LUT− 144 to adjust those entries for residual errors.

The LMS method on the LUT residual errors adjusts XE1, XE2, OS1, and OS2 to minimize the residual error w, which is set to zero in eqn. (6):

$$w=r-a-p-OSr_a=0$$

The reference signal r and actual signal a and the average offset $OSr_a$ were obtained previously. The polynomial p is obtained using the coefficients $\beta_0$, $\beta_1$, $\beta_2$, $\beta_3$, etc., obtained by the Multi-Variable Stochastic Gradient Descent Method described above. Polynomial p is obtained by eqn. (7):

$$P=\beta_0+\beta_1 x+\beta_2 x^2+\beta_3 x^3+$$

The actual value a is obtained by summing the entries in LUT+ 142 that have their corresponding DS[i] bit=1 and adding the next OS1 value when the MSB, DS[MSB]=0, or eqn. (8):

$$a=DS[9:0]x_1^{n+1}+os_1^{n+1}$$

Before any adjustments, the values X in LUT+ 142 and LUT− 144 are the same as the values in pre-calibrated LUT 111 for corresponding entries with the same ideal weight or radix. However, during the LMS method these entry values X in LUT+ 142 are adjusted for the residual error XE1 by eqn. (9):

$$x_1^{n+1}=x+xe_1^{n+1}$$

When MSB, DS[MSB]=1, the actual value a is obtained by summing the entries in LUT− 144 that have their corresponding DS[i] bit=0 and adding the next OS2 value, or eqn. (10):

$$a=-DS[9:0]'x_2^{n+1}+os_2^{n+1}$$

The entries in LUT− 144 represent negative values, but do not have a sign bit, so the negative sign is added to eqn. (10). These entry values X in LUT− 144 are adjusted for the residual error XE2 by eqn. (11):

$$x_2^{n+1}=x+xe_2^{n+1}$$

The LMS method is used to minimize the residual error w in the following four eqns. (12):

$$xe_1^{n+1}=xe_1^n+\mu_w w$$

$$xe_2^{n+1}=xe_2^n-\mu_w w$$

$$os_1^{n+1}=os_1^n+\mu_w w$$

$$os_2^{n+1}=os_2^n+\mu_w w$$

where $u_w$ is the LMS update rate. After many updates, such as 100,000, the LMS method converges to values for X1, X2, OS1, OS2 with a minimum residual error w. Then the XE1 values are added to the X values in entries in LUT+ 142 to adjust the entries in LUT+ 142 for the converged XE1 errors, and the XE2 values are added to the X values in corresponding entries in LUT− 144 to adjust the entries in LUT− 144 for the converged XE2 errors. The single converged OS1 value is a global value that is added to each sum of entries from LUT+ 142 during data conversions, while the single converged OS2 value is a global value that is added to each sum of entries from LUT− 144 during data conversions.

Figure 9:
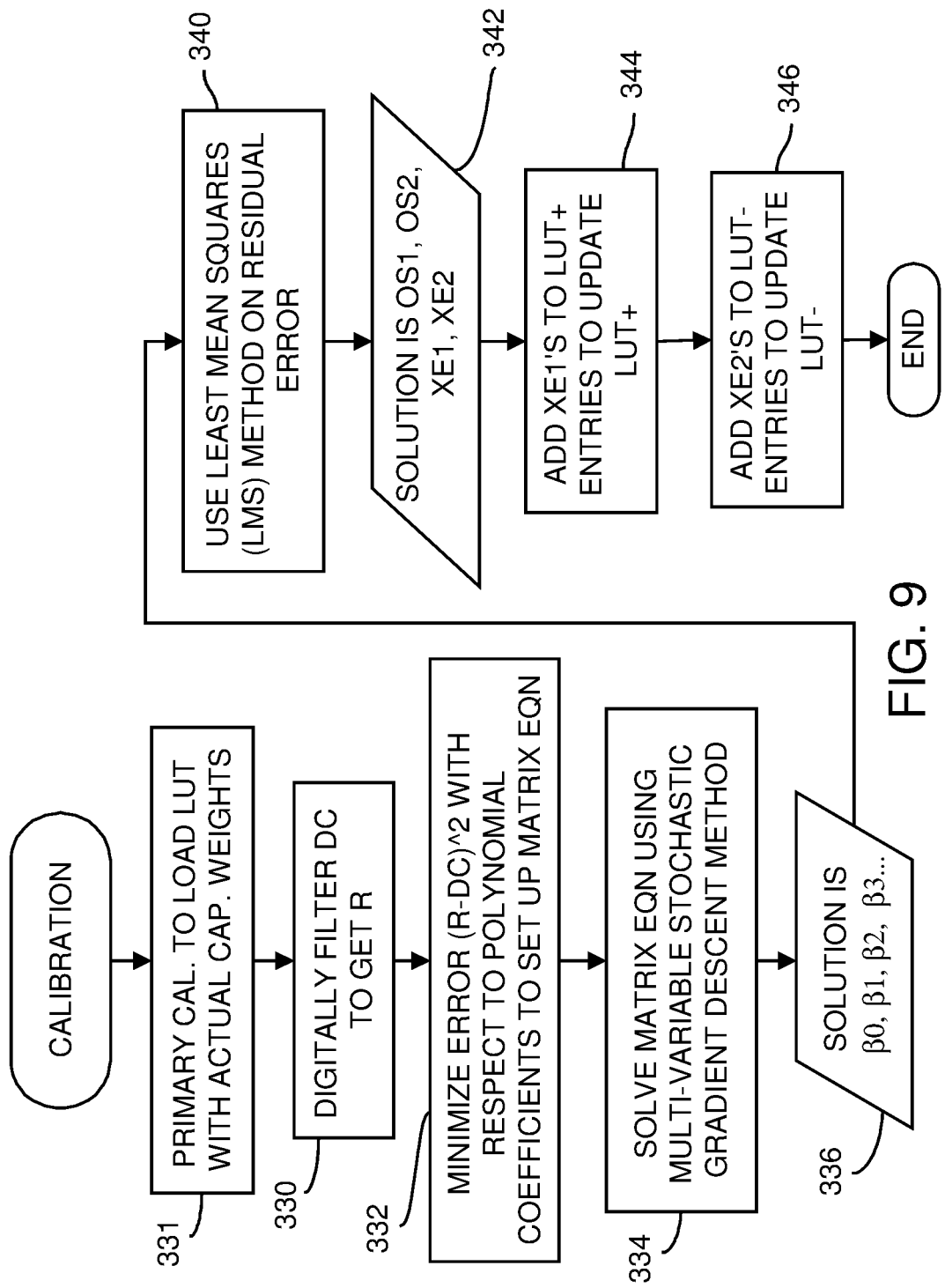
FIG. 9 is a flowchart of a secondary calibration method to generate polynomial correction terms and to further correct a pre-calibrated LUT.

FIG. 9—Overview of Secondary Calibration Methods

FIG. 9 is a flowchart of a secondary calibration method to generate polynomial correction terms and to further correct a pre-calibrated LUT. Primary or LUT calibration is performed, and LUT 111 is populated with entries of actual calibrated capacitor weights that were found by LUT calibration. The calibrated entries in LUT 111 are replicated into LUT+ 142 and into LUT− 144, step 331.

LUT summed output DC, or the post-LUT error-corrected output DC' (FIG. 4) is the actual signal a. This actual signal a is digitally filtered to obtain a reference signal r, step 330. The digital filter can be a digital filter that removes harmonics, a Fast Fourier Transform (FFT) that removes harmonics, or another digital filter that recovers a fundamental signal (r) from an actual signal (a, DC, or DC').

The derivative of the squared error (r−DC')^2 with respect to polynomial coefficients $\beta_0$, $\beta_1$, $\beta_2$, $\beta_3$, . . . is minimized using a matrix equation, step 332, such as matrix eqn. (4) shown earlier. This matrix equation is solved using the Multi-Variable Stochastic Gradient Descent Method, step 334. The solution to the matrix equation obtained, coefficients $\beta_0$, $\beta_1$, $\beta_2$, $\beta_3$, etc., is output or stored for later use during data conversions, step 336.

A residual error remains. The LMS Method for LUT Residual Errors described above is performed on the residual error, step 340. The LMS method generates XE1 values, XE2 values, and offsets OS1 and OS2. These generated solution values are stored, step 342.

There is one XE1 value for each entry in LUT+ 142. Each XE1 value is added to its corresponding entry in LUT+ 142 to adjust the entry to correct the residual error, step 344. Similarly, there is one XE2 value for each entry in LUT− 144. Each XE2 value is added to its corresponding entry in LUT− 144 to adjust the entry to correct the residual error, step 346.

Secondary calibration produces coefficients $\beta_0$, $\beta_1$, $\beta_2$, $\beta_3$, offsets OS1, OS2, and the XE1 and XE2 updated entries in LUT+ 142 and LUT− 144 that are used during ADC data conversion operations to further correct non-linearity errors that remain in LUT 111 after primary LUT calibration.

Figure 10:
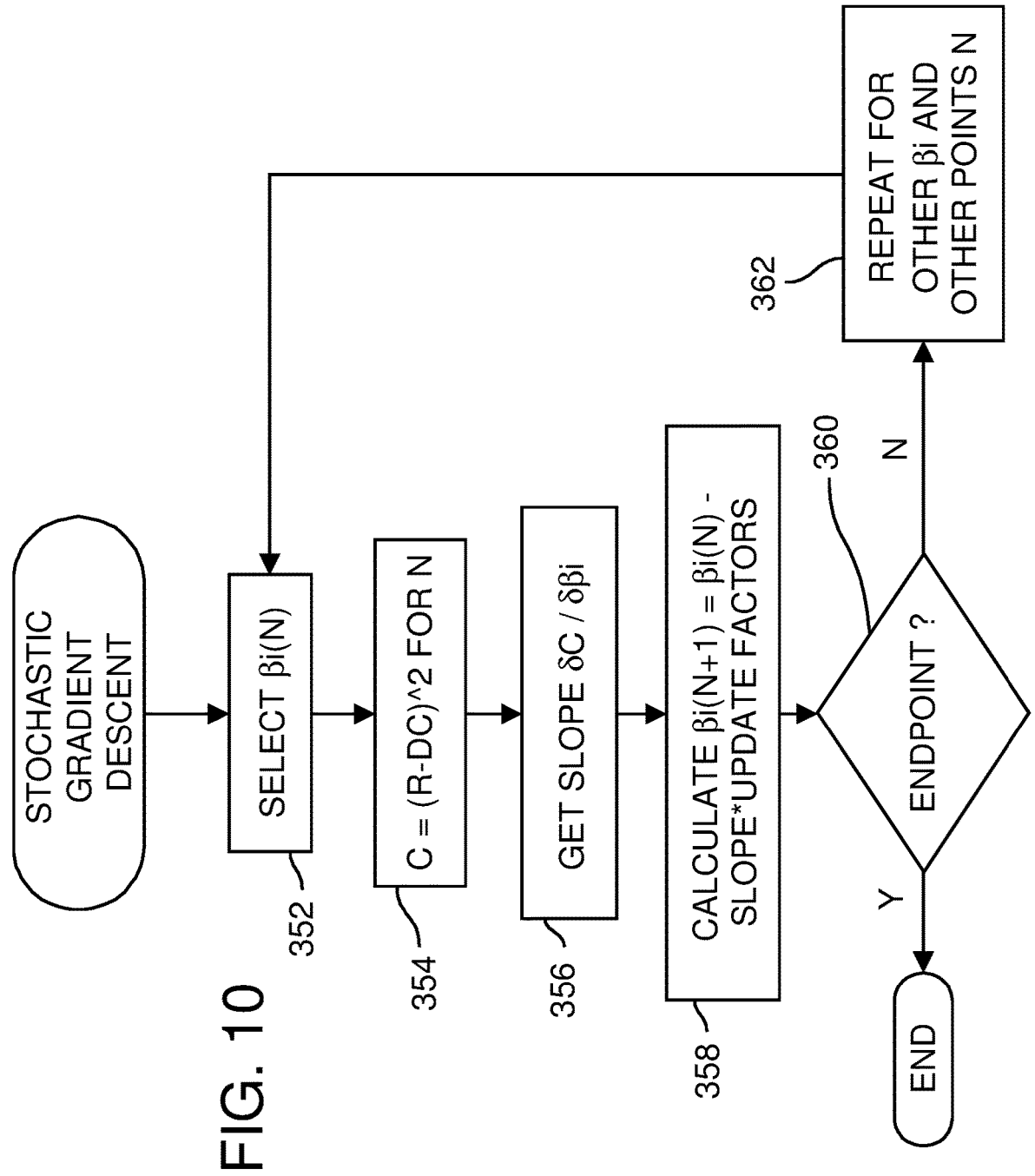
FIG. 10 shows the Multi-Variable Stochastic Gradient Descent Method in more detail.

FIG. 10 shows the Multi-Variable Stochastic Gradient Descent Method in more detail. One of coefficients $\beta_0$, $\beta_1$, $\beta_2$, $\beta_3$, etc., is selected as $\beta_1(N)$, step 352. The curvature error C is $(r-DC')^2$, and the value of C is calculated from r and DC', step 354, for the current value of N. The slope is obtained by taking the derivative of C with respect to as $\beta_1(N)$, step 356. The next value $\beta_1(N+1)$ is obtained by multiplying the slope from step 356 with LMS update factors and adding to the prior value $\beta_1(N)$, step 358, using one of eqn. (5) shown earlier.

The overall error e is obtained using the most-recent set of coefficients $\beta_0$, $\beta_1$, $\beta_2$, $\beta_3$, ... from the matrix eqn. (4) shown above. When this error e is large than an endpoint threshold, step 360, then another $\beta_1(N)$, is selected, step 362, and the processes repeated from step 352. N is a training parameter that can range from 1 to a training endpoint, such as 200,000.

Once the error is below the error endpoint threshold, step 362, then the Multi-Variable Stochastic Gradient Descent Method ends, and the most recent coefficients $\beta_0$, $\beta_1$, $\beta_2$, $\beta_3$, etc., are stored.

Figure 11:
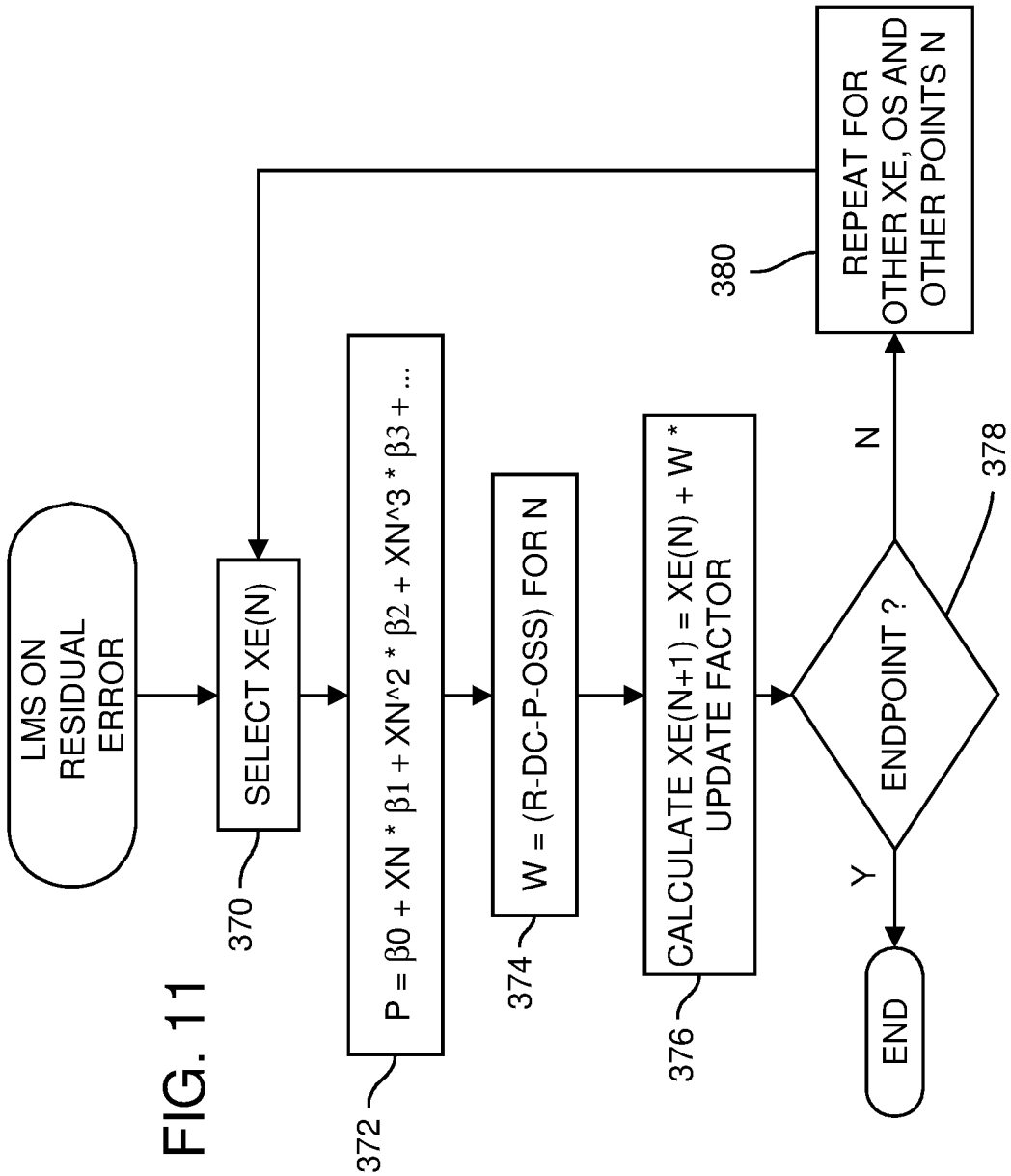
FIG. 11 shows the LMS Method for LUT Residual Errors in more detail.

FIG. 11 shows the LMS Method for LUT Residual Errors in more detail. One of the residual errors XE(N) is selected, step 370. XE(N) can be XE1 for errors in LUT+ 142, or XE2 for errors in LUT− 144, or can be offsets OS1 or OS2.

The polynomial term p is calculated, step 372, using eqn. (7) above with the values of coefficients $\beta_0$, $\beta_1$, $\beta_2$, $\beta_3$, etc., that were generated by the Multi-Variable Stochastic Gradient Descent Method. XN is the normalized value of either X1 or X2, X1/sum(LUT+) or X2/sum(LUT−), respectively.

The residual error w is generated for the current value of N, step 374, as r−a−p−OSS, where r is the reference value, a is the actual value, p is the polynomial value calculated in step 372, and OSS is the average or systematic offset $OSr_a$, which can be obtained by averaging the r−a differences over many or all code values.

The next value XE(N+1) is obtained by multiplying w from step 374 with the LMS update factor $u_w$ and adding to the prior value XE(N), step 376, using one of eqn. (12) shown earlier.

The residual error w is averaged, summed, or accumulated for all values of N. When this error is larger than an endpoint threshold, step 378, then another XE(N) is selected, step 380, and the processes repeated from step 370. The endpoint can also be a fixed number of training data, such as 200K.

Figure 12A:
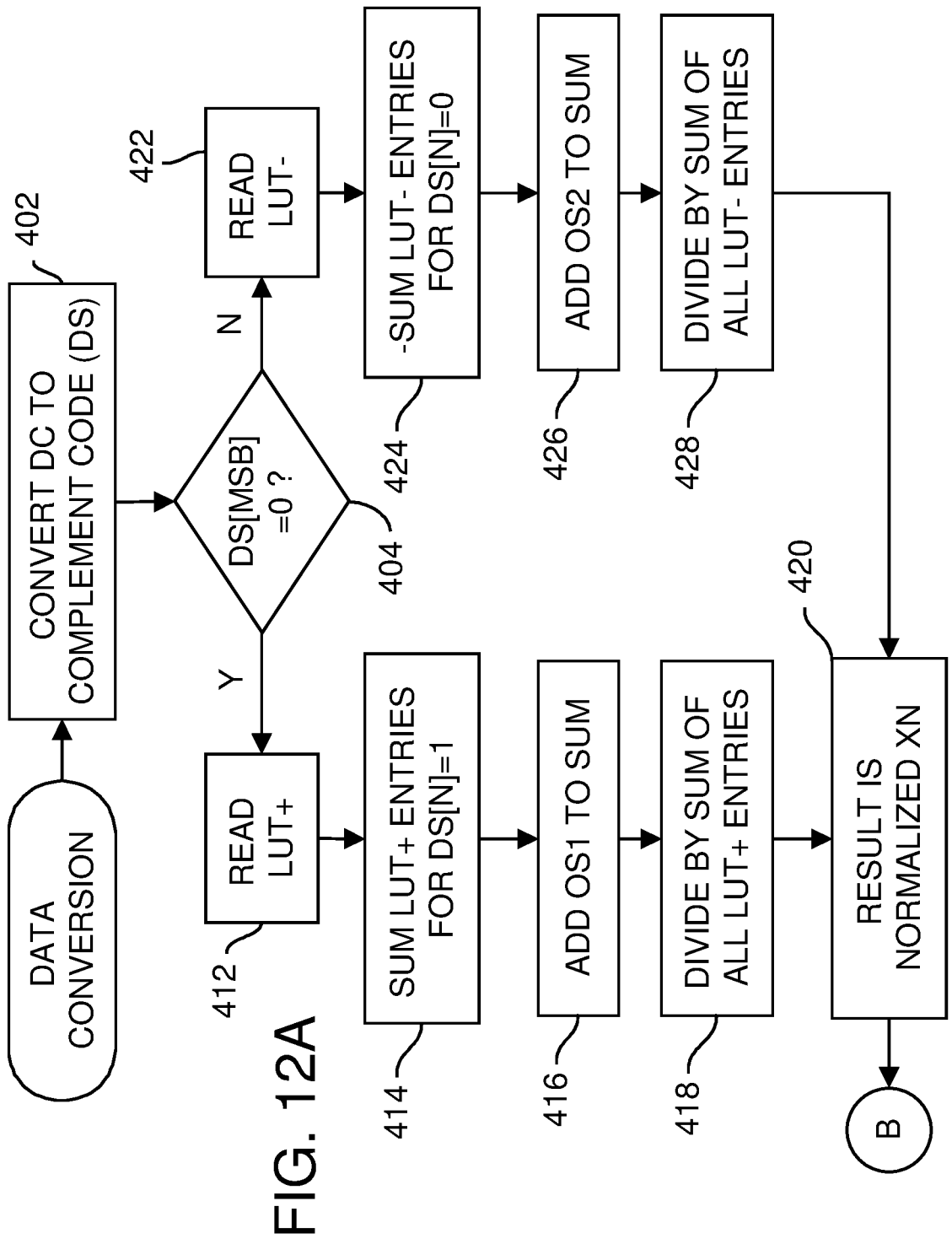
FIGS. 12A-12B show a data conversion operation using error correction obtained from secondary calibration.
Figure 12B:
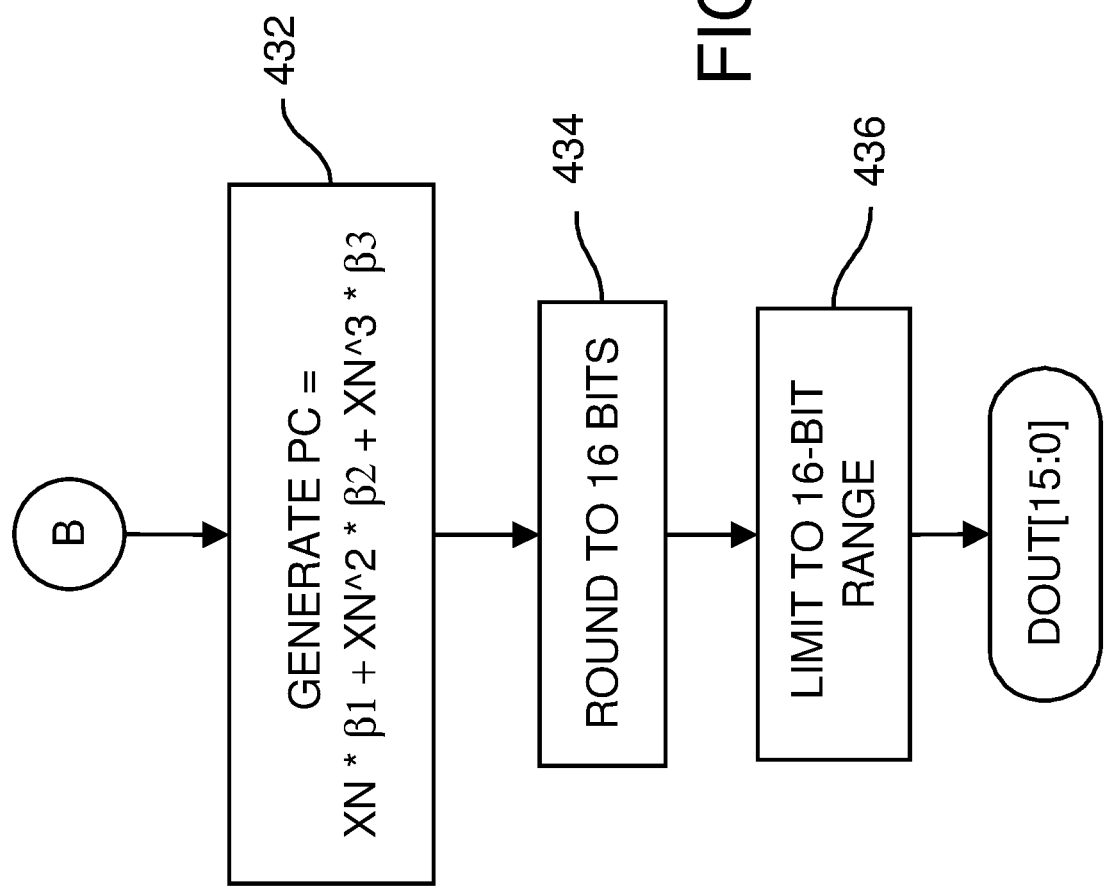

FIGS. 12A-12B show a data conversion operation using error correction obtained from secondary calibration. LUT 111 is not used. Instead LUT+ 142 and LUT− 144 are used. Data conversion operations occur after primary calibration has updated LUT 111 with weights calibrated for the actual measured weights of capacitors in the array, and after secondary calibration has adjusted these weights further in LUT+ 142 and LUT− 144. Once both primary (LUT) calibration and secondary calibration (FIG. 9) have finished, normal ADC operation can occur wherein an analog input signal is converted to a multi-bit digital value. This is known as a data conversion operation.

The analog input is applied to the capacitor array and capacitors in the array are switched on and off and voltages compared and SAR 104 updated with the search result during a search sequence. Once the search sequence ends, SAR 104 contains the digital code DC that indicates which capacitors are on and which are off to equal the analog input. Rather than access LUT 111 with DC, either LUT+ 142 or LUT− 144 is accessed using the level-shifted DC, DS. DS is generated, step 402, by complementing the digital code DC, so that DS can be positive or negative. Since the capacitor sizes are not necessarily binary weighted, this is not a 2's complement, but is a more complex code complement operation based on a SAR search, shown in detail later in FIG. 18.

The MSB of the complemented code, DS[MSB], is the sign bit that determines, step 404, when the complemented code DS is positive, and LUT+ 142 is accessed, step 412, and when the complemented code DS is negative, and LUT− 144 is accessed, step 422.

When DS[MSB] is zero, step 404, the complemented code is positive, and LUT+ 142 is read, step 412. All entries from LUT+ 142 having a corresponding DS[n] bit=1 are summed together, step 414. The first offset OS1 generated by secondary calibration (FIG. 9, step 342 and FIG. 11, step 380) is added to the sum, step 416. The sum is normalized by dividing by the sum of all entries in LUT+ 142, step 418, to generate the normalized result XN, step 420.

When DS[MSB] is one, step 404, the complemented code is negative, and LUT− 144 is read, step 422. All entries from LUT− 144 having a corresponding DS[n] bit=0 are summed together, step 424. This sum represents a negative number, so the sign bit on the sum is set to 1 to negate the sum. The second offset OS2 generated by secondary calibration is added to the sum, step 426. The sum is normalized by dividing by the sum of all entries in LUT− 144, step 428, to generate the normalized result XN, step 420.

In FIG. 12B, step 432, the normalized sum XN is multiplied by the first polynomial coefficient $\beta_1$, squared and multiplied by the second polynomial coefficient $\beta_2$, and cubed and multiplied by the third polynomial coefficient BV and the three produces summed to generate a polynomial corrected code PC. PC can be generated by a multiplier-adder or other computational unit that generates:

$$PC = XN^*\beta_1 + XN^2{}^*\beta_2 + XN^3{}^*\beta_3$$

The polynomial corrected code PC have generated additional significant bits, so PC is rounded to 16 bits, step 434 and limited to the 16-bit range, step 436. The rounded, range-limited output DOUT[15:0] is output as the final digital code that represents the analog input signal after all secondary corrections.

Figure 13:
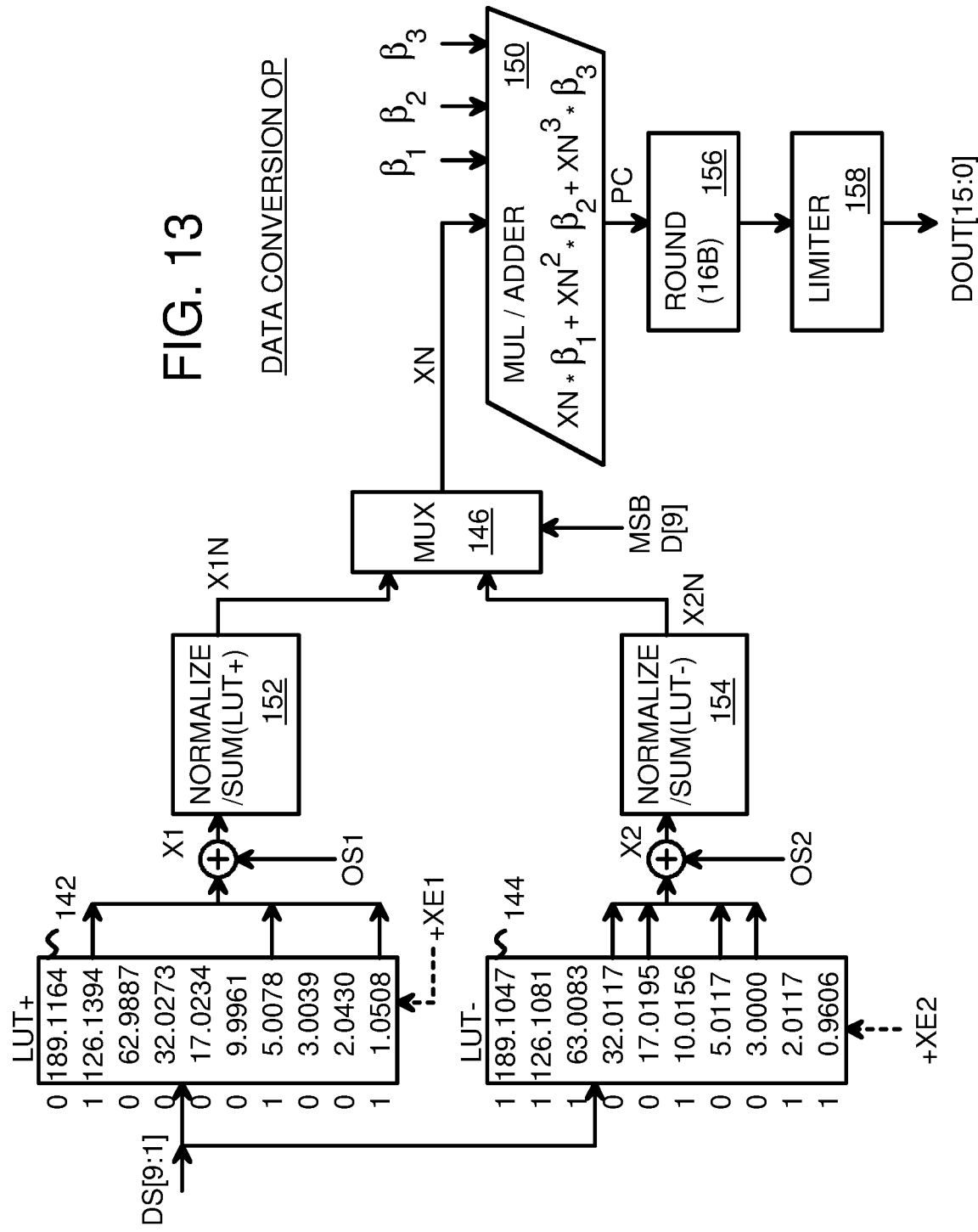
FIG. 13 is an ADC data corrector using two LUT's for positive and negative entries with polynomial secondary correction.

FIG. 13 is an ADC data corrector using two LUT's for positive and negative entries with polynomial secondary correction. The data code DC from searching the capacitor array may or may not be corrected by an offset and gain factors. This data code is complemented to shift the code level from a range of 0 to MAX to a range of MAX/2 to −MAX/2 to generate the shifted data code DS[9:0].

This shifted data code DS[9:1] is applied to both LUT+ 142 and LUT− 144. Although LUT+ 142 and LUT− 144 are initially loaded with the identical values, which are the capacitor-actual-size corrected entries from LUT 111 after capacitor array LUT calibration, secondary calibration generates XE1 values for each entry in LUT+ 142, and adds these XE1 values to update the entries in LUT+ 142. Likewise, the XE2 values generated during secondary calibration are added to LUT− 144 (FIG. 9, step 346) to update the entries in LUT− 144. Thus LUT+ 142 and LUT− 144 have slightly different entry values. For example, the MSB entry in LUT+ 142 is 189.1164 while the MSB entry in LUT− 144 is 189.1047 in the example of FIG. 13.

The MSB of the shifted data code, DS[9], is the sign bit. When DS[9] is 0, the number is positive and all entries X1[n] in LUT+ 142 having a corresponding DS[n]=1 are read and summed together. Then offset OS1 is added to get X1. Normalizer 152 divides X1 by the sum of all entries in LUT+ 142 to get the normalized X1N. Mux 146 selects X1N as XN when DS[9]=0.

For example, when DC is 1101001101, its complement DS is 0100001001, so the three=1 entries, 126.1394, 5.0078, and 1.0508 from LUT+ 142 are added together to get 132.198. When OS1 is −0.7188, X1 is 131.4792, which is normalized by dividing by the sum of all entries in LUT+ 142, 448.3968, to get X1N.

When DS[9] is 1, the number is negative and all entries X2[n] in LUT− 144 having a corresponding DS[n]=0 are read and summed together and the sign bit set to 1 to indicate a negative sum. Then offset OS2 is added to get X2. Normalizer 154 divides X1 by the sum of all entries in LUT− 144 to get the normalized X2N. Mux 146 selects X2N as XN when DS[9]=1.

For example, when DC is 0101001101, its complement DS is 1110010011, so the four=0 entries, 32.0117, 17.0195, 5.0117, and 3.0000 from LUT− 144 are added together and negated to get −57.0429. When OS2 is 0.6563, X2 is −56.3866, which is normalized by dividing by the sum of all entries in LUT− 144, 448.2522, to get X2N.

Multiply-adder 150 receives the coefficients $\beta_1$, $\beta_2$, $\beta_3$, and multiplies these coefficients by XN, XN^2, and XN^3, respectively. The sum of these products is polynomial corrected code PC. Rounder 156 rounds the result to a desired number of significant bits, such as 16, while limiter 158 limits the code to the desired range. The final polynomial-corrected output DOUT[15:0] can have more bits of significance than shifted data code DS[9:1] due to the polynomial error correction. DOUT[15:0] can be a 2's complement code that can be negative or positive. DOUT[15:0] can also be level shifted to a binary code (not shown).

Figure 14:
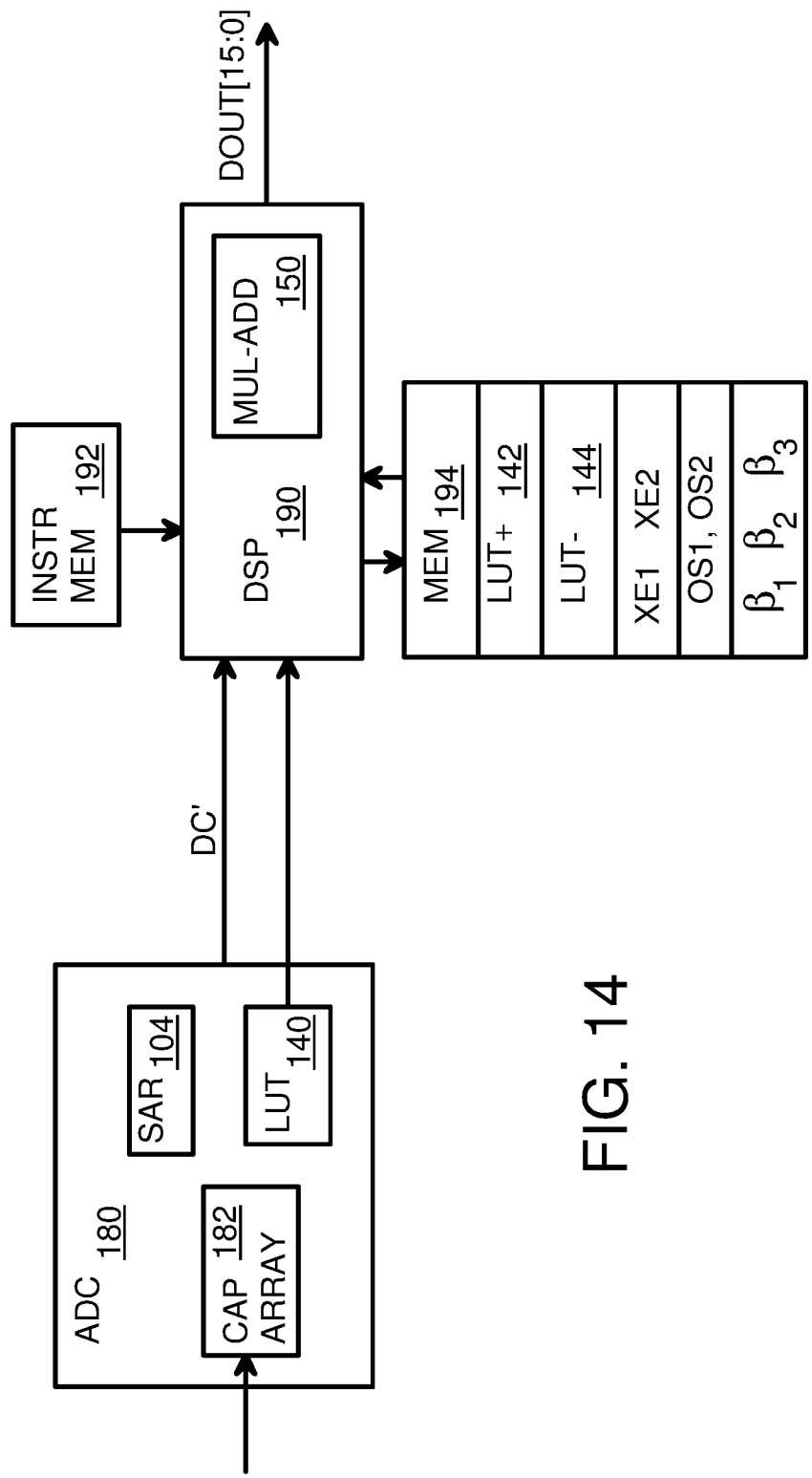
FIG. 14 shows an ADC with secondary calibration.

FIG. 14 shows an ADC with secondary calibration. ADC 180 can be a standard ADC with weighted capacitor array 182. The ideal weighs of these capacitors in LUT 140 are updated with their actual weights during primary (LUT) calibration.

During secondary calibration, Digital Signal Processor (DSP) 190 performs the steps of FIGS. 9-11 by executing instructions or code in instruction memory 192. DSP 190 executes the Multi-Variable Stochastic Gradient Descent Method (FIG. 10) to generate coefficients $\beta_0$, $\beta_1$, $\beta_2$, $\beta_3$, etc., which are stored in memory 194.

The calibrated entries in LUT 140 are copied into LUT+ 142 and LUT− 144 in memory 194 and adjusted for errors XE1, XE2. OS1 and OS2 are also generated by DSP 190 executing instructions to perform the LMS Method for LUT Residual Errors (FIG. 11).

After secondary calibration is completed by DSP 190, normal data conversions can occur. The analog input is applied to weighted capacitor array 182 and ADC 180 performs a search routine to load SAR 104 with the digital code that best fits the analog input. The digital code DC' may be adjusted with an offset or gain or other correction factors used by ADC 180.

DSP 190 uses the MSB of DC' to select either LUT+ 142 and LUT− 144, and the polarity of the DC' bits used to select entries for summing. OS1 or OS2 is added and the sum normalized. Then DSP 190 uses multiply-adder 150 and the coefficients $\beta_1$, $\beta_2$, $\beta_3$, to generate polynomial corrected code PC, which is output as data code output DOUT[15:0] after rounding and limiting (FIG. 12A-12B).

Figure 15:
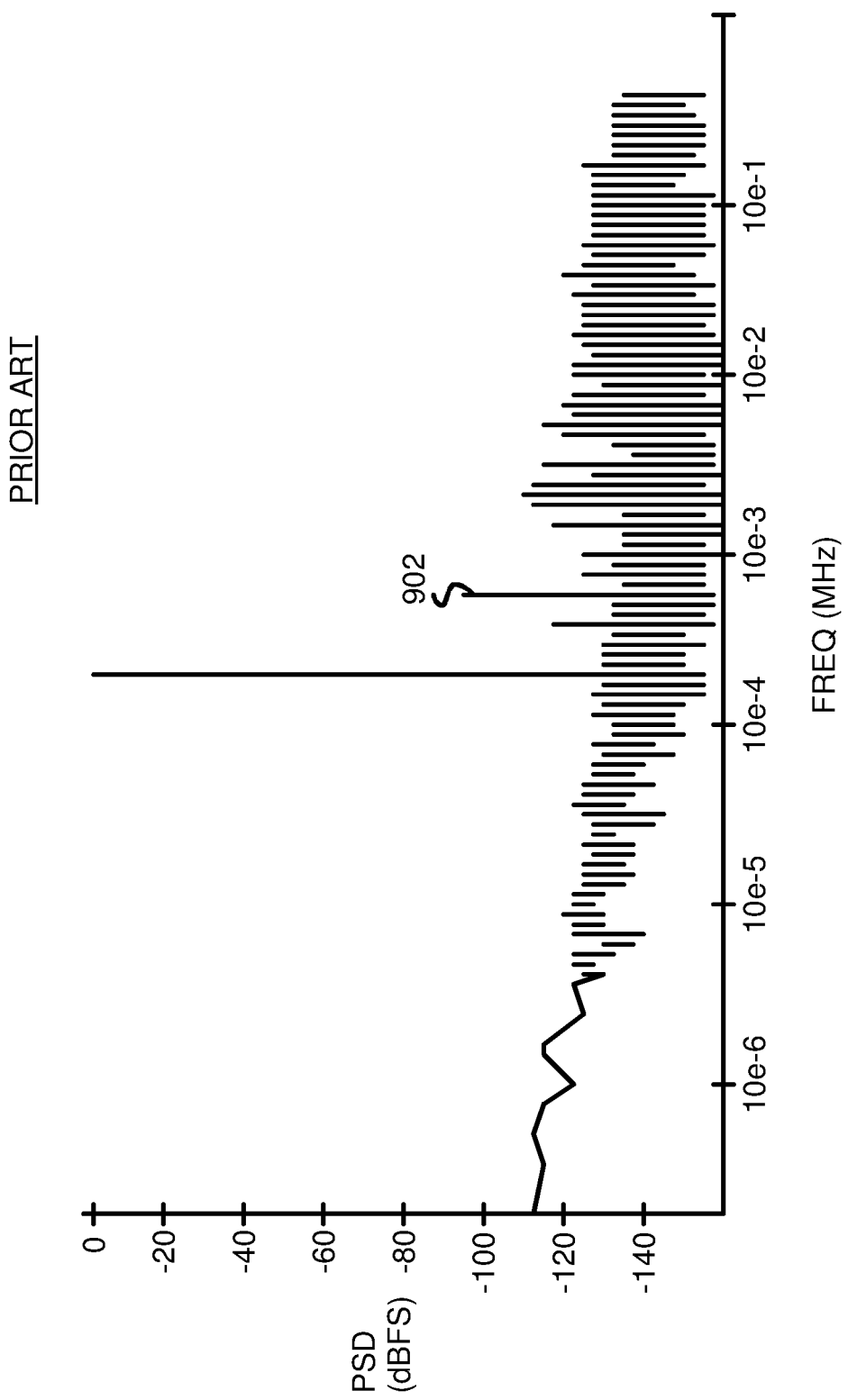
FIG. 15 is a plot of the spectral density of an ADC before LMS calibration.

FIG. 15 is a plot of the spectral density of an ADC before LMS calibration. The decibels relative to full scale (dBFS) of the Power Spectral Density (PSD) is plotted from a Fast Fourier Transformer (FFT) of a simulation of a typical ADC after LUT calibration. Non-linearity errors in the calibrated LUT cause harmonics such as third harmonic 302 in the spectrum. These harmonics 902 are undesirable.

Figure 16:
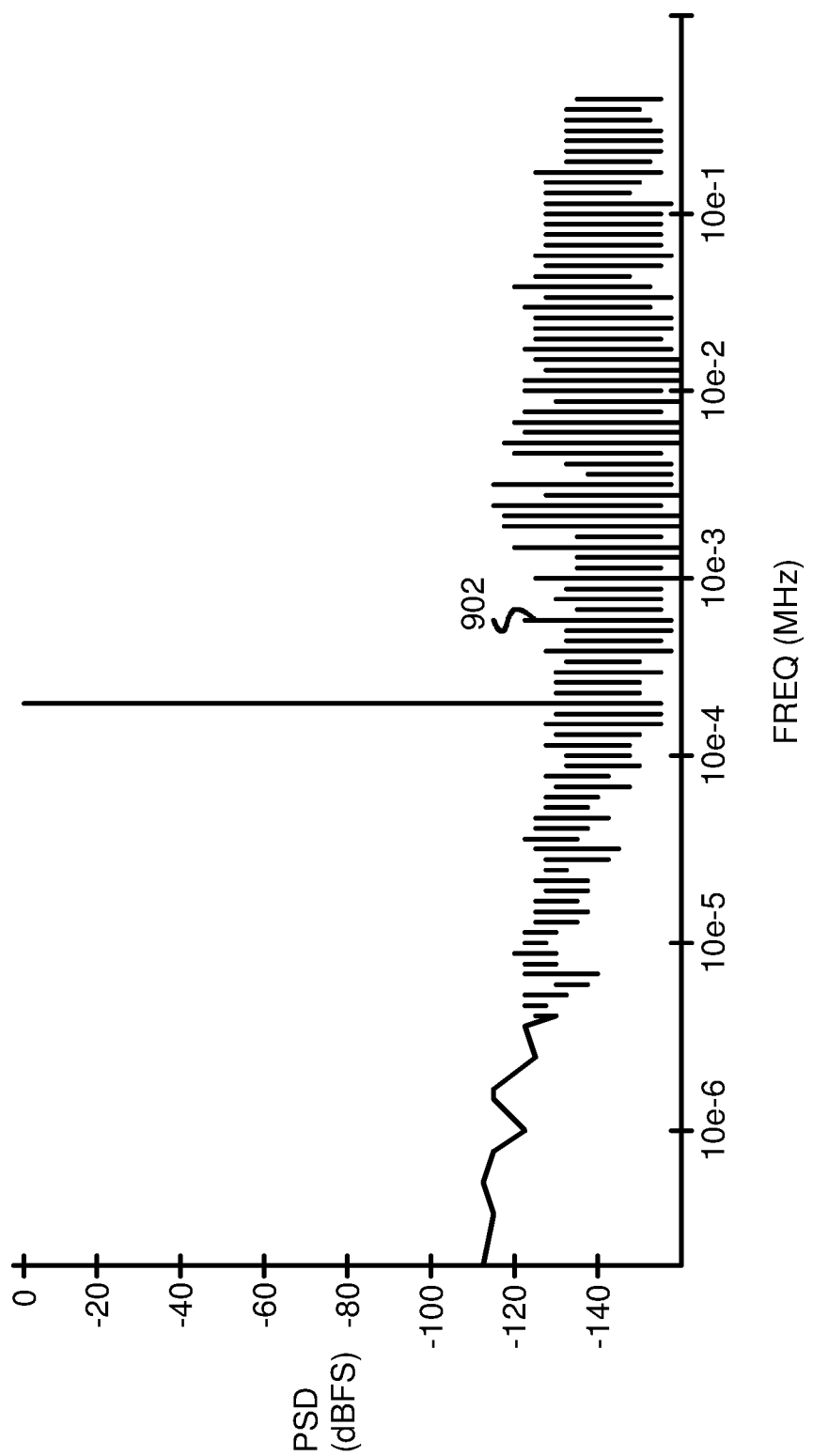
FIG. 16 is a plot of the spectral density of an ADC after LMS calibration.

FIG. 16 is a plot of the spectral density of an ADC after LMS calibration. The decibels relative to full scale (dBFS) of the Power Spectral Density (PSD) is plotted from a Fast Fourier Transformer (FFT) of a simulation of a typical ADC after LUT calibration and after the secondary calibration of FIGS. 9-11. Non-linearity errors are reduced by the polynomial corrected code using coefficients $\beta_1$, $\beta_2$, $\beta_3$, generated by the Multi-Variable Stochastic Gradient Descent Method, and by using two Lookup Tables, LUT+ 142 and LUT− 144, with LMS-corrected entries using the LMS Method for LUT Residual Errors.

In particular, the even harmonics are greatly reduced by having two LUT's rather than just one LUT. Odd harmonics are greatly suppressed by the polynomial correction of multiply-adder 150. The height of third harmonic 902 is significantly reduced in FIG. 16 compared with FIG. 15.

In test results for differential implementations, the third harmonic HD3 is improved by 30 dB by splitting LUT 111 into LUT+ and LUT−, and applying two different offsets OS1, OS2. The second harmonic HD2 is also improved for single-ended implementations. Updating of entries in LUT+, LUT− using LMS improves Total Harmonic Distortion (THD) by another 10 dB compared with using only the gradient descend method.

Figure 17:
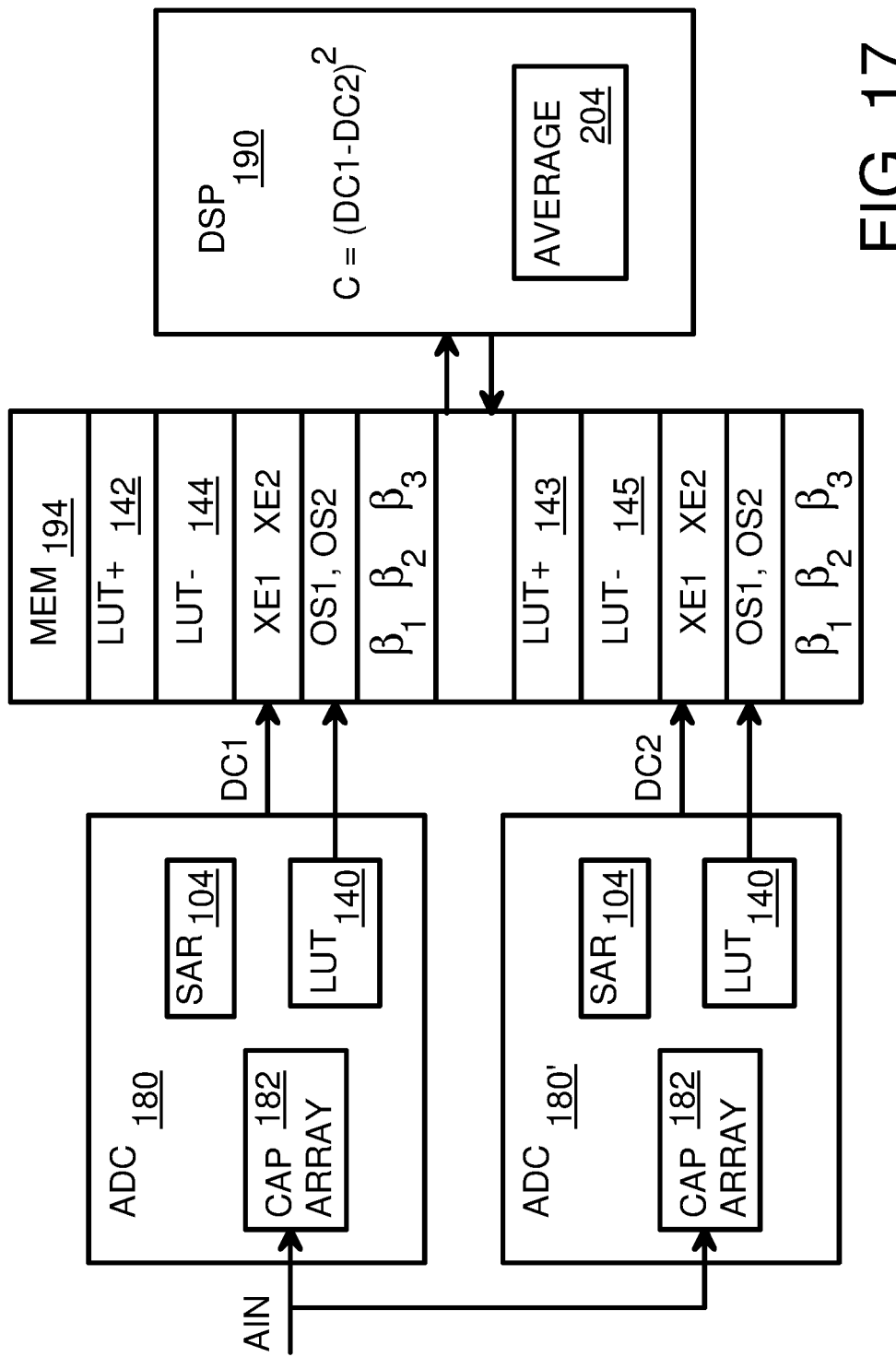
FIG. 17 is an apparatus for foreground secondary calibration.

FIG. 17 is an apparatus for foreground secondary calibration. Two identical ADCs 180, 180' receive the same analog input AIN and each has its own weighted capacitor array 182 and LUT 140. ADC 180 generates data code DC1 while ADC 180' generates data code DC2 as outputs.

DSP 190 can generate the curvature error as (DC1−DC2)^2 rather than filter DC to get reference signal r and use (DC−a)^2 as the error, as described earlier. The curvature error is the difference in data codes output by the two ADC's.

DSP 190 could separately calibrate ADC 180 to get a first set of parameters including coefficients $\beta_1$, $\beta_2$, $\beta_3$, offsets OS1, OS2, entry errors XE1, XE2, and LUT+142 and LUT− 144, and then calibrate ADC 180' to get a second set of parameters including coefficients $\beta_1$, $\beta_2$, $\beta_3$, offsets OS1, OS2, entry errors XE1, XE2, and LUT+143 and LUT− 145, that are stored in memory 194. DSP 190 could then use averager 204 to average these two sets of parameters to get a final averaged set of parameters.

FIG. 18 is a flowchart of a non-binary code complementor. Both binary and non-binary code can be converted into complement code using a SAR search method in the digital domain, yielding a residue error within +/−0.5 LSB.

Code complementor 148 can perform the SAR search routine shown in FIG. 18. The midpoint MID of the LUT is calculated, step 550, by summing the entries in LUT 111 and adding half of a LSB, or MID=SUM(LUT(j))+0.5, so all values of j in LUT 111. The index parameter j is set to the MSB, such as 9 for a 10-bit value of the binary code D[9:0] (FIGS. 4, 6) from SAR 104, step 552. The remainder Q is set to the input binary code D minus the midpoint, or Q=DC−MID, step 554.

When Q is more than 0, step 560, the value is greater than the midpoint, and will be converted to a positive value. The current bit B(j) is set to 1 when Q−LUT(j)+0.5 is more than 0, otherwise B(j) is cleared to 0, step 562. The remainder Q is reduced by LUT(j) when B(j)=1, otherwise Q is not changed, step 564. When index j has not yet reached 0, the LSB, step 566, j is decremented, step 568, and steps 562, 564 repeated for the next bit j−1. When j reaches 0, step 566, B[MSB:0] is output as the complement code.

When Q is less than 0, step 560, the value is less than the midpoint, and will be converted to a negative value. The current bit B(j) is cleared to 0 when Q+LUT(j)−0.5 is less than 0, otherwise B(j) is set to 1, step 572. The remainder Q is increased by LUT(j) when B(j)=0, otherwise Q is not changed, step 574. When index j has not yet reached 0, the LSB, step 576, j is decremented, step 578, and steps 572, 574 repeated for the next bit j−1. When j reaches 0, step 566, B[MSB:0] is output as the complement code.

Alternate Embodiments

Several other embodiments are contemplated by the inventors. For example, while differential comparison with comparator 12 of fully differential capacitor arrays have been shown with matching upper and lower capacitor arrays, single-ended calibration could also be substituted by connecting one input of comparator 12 to ground or to another fixed voltage, and eliminating the lower capacitor arrays.

The entries of LUT+ 142 and LUT− 144 for a particular weight or digital-analog element such as a capacitor in the array typically are the same for lower-significant binary bits, but differ by a small amount for higher-significant binary bits. For example, the corresponding entries in LUT+ 142 and LUT− 144 for a particular binary bit or ideal capacitor weight may differ by no more than 5% or 10% since the non-linearity errors corrected for by XE1 and XE2 are relatively small.

Some or all of DSP 190 could be replaced with hardware such as programmable logic, FPGA, or other logic gates on an Integrated Circuit (IC) or other chip. Various combinations of hardware, software, firmware, etc. may be substituted.

Multiply-adder 150 receives the coefficients $\beta_1$, $\beta_2$, $\beta_3$, and multiplies these coefficients by XN, XN^2, and XN^3, respectively. The sum of these products is polynomial corrected code PC. Multiply-adder 150 may be a separate adder and multiplier, or may be part of a larger Arithmetic-Logic Unit (ALU) or computational unit, or may be part of DSP 190 or separate from DSP 190. Multiply-adder 150 does not receive the zero-order polynomial coefficient $\beta_0$ because this is similar to an offset, and offsets OS1, OS2 perform a similar function. Higher-order coefficients such as 34 are not used by multiply-adder 150 because of their diminishing importance, as the first three coefficients provide a sufficient amount of non-linearity correction. However, additional coefficients could be used if a higher precision was desired.

While an ADC with a capacitor array has been described, secondary error calibration can be applied to other mixed-signal circuits such as Digital-to-Analog Converters (DACs). Either or both of the Multi-Variable Stochastic Gradient Descent Method and the LMS Method for LUT Residual Errors can be applied in any type of ADC or in many kinds of mixed-signal devices. The mixed-signal device can be a digital-analog converter, a SAR ADC, a pipelined converter, a pipeline-SAR, a flash ADC, a Delta-Sigma ADC. The methods can reduce nonlinearity error in any type of ADC or many mixed-signal devices.

While capacitors 14-19 have been described, these capacitors are digital-analog elements that convert a digital signal from SAR 104 into an analog voltage sensed by comparator 12. Other kinds of digital-analog elements could be substituted, such as the parallel current sources, resistors, or various combinations, and in parallel, serial, or combined network arrangements.

The primary LUT calibration and secondary calibration, and other error calibrations may be executed together as part of a single calibration routine. External signals are not needed for calibration, so this overall calibration routine is a self-calibration routine. The calibration routine may be executed on power-up, and may be repeated periodically, or when other parts of the system detect a temperature or supply voltage shift, or detect other problems such as aging.

While capacitors having values such as 1, 1, 2, 3, 5, 10, 17, 32 times the unit capacitance C have been described, other values may be substituted. Binary-weighted values such as 1, 1, 2, 4, 8, 16, 32 may be used. However, the sum of the capacitor values below the MSB is 1+1+2+4+8+16=32 while for the non-binary array is 1+1+2+3+5+10+17=38. Since 38 is 6 more than the MSB of 32, a measured radix up to 38 can be detected for the 32 C capacitor, while for the binary example radixes above the nominal 32 cannot be detected. Thus a monotonic non-binary series of capacitor values has an advantage of being able to detect a mismatch on the MSB that is greater than the MSB. The cost is one additional capacitor pair.

Figure 1:
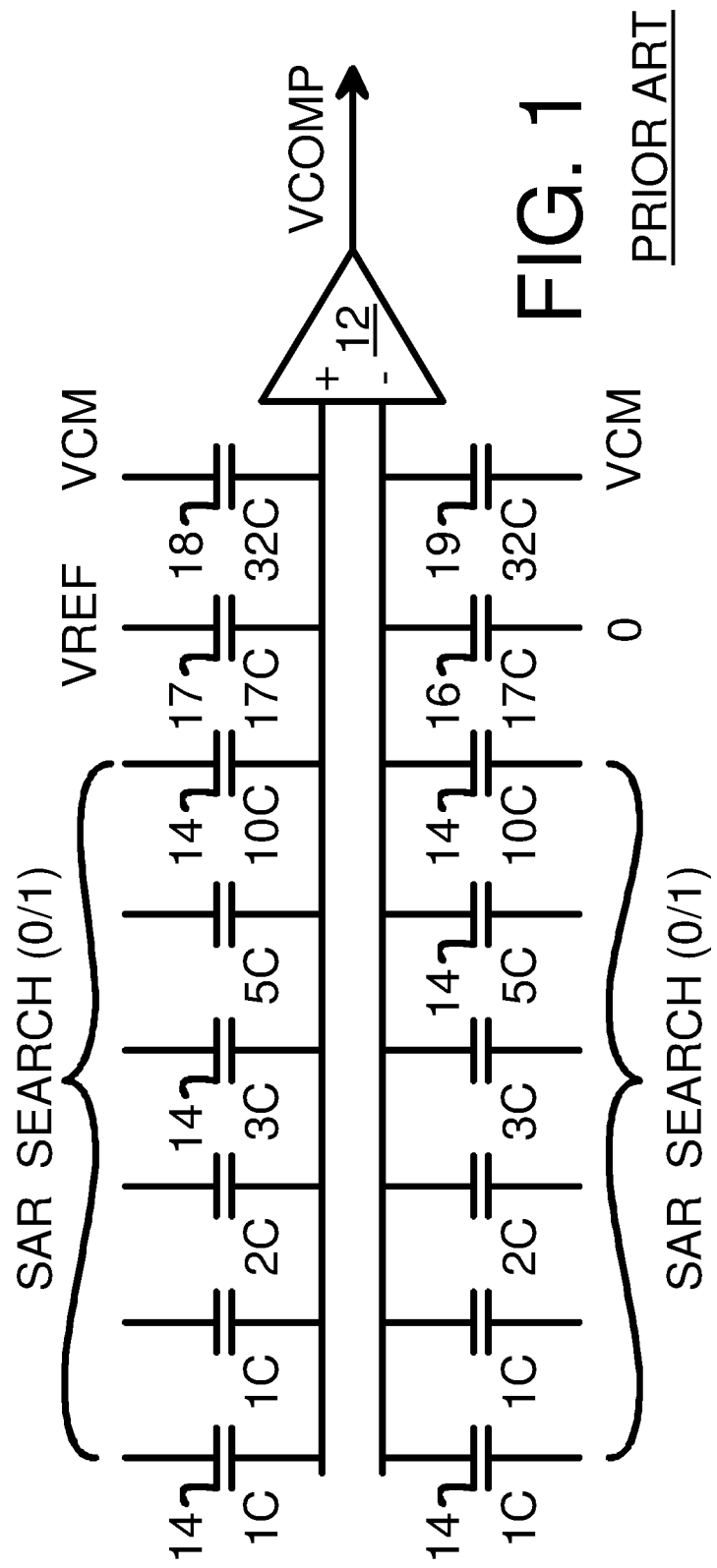
FIG. 1 shows a prior-art ADC.
Figure 2:
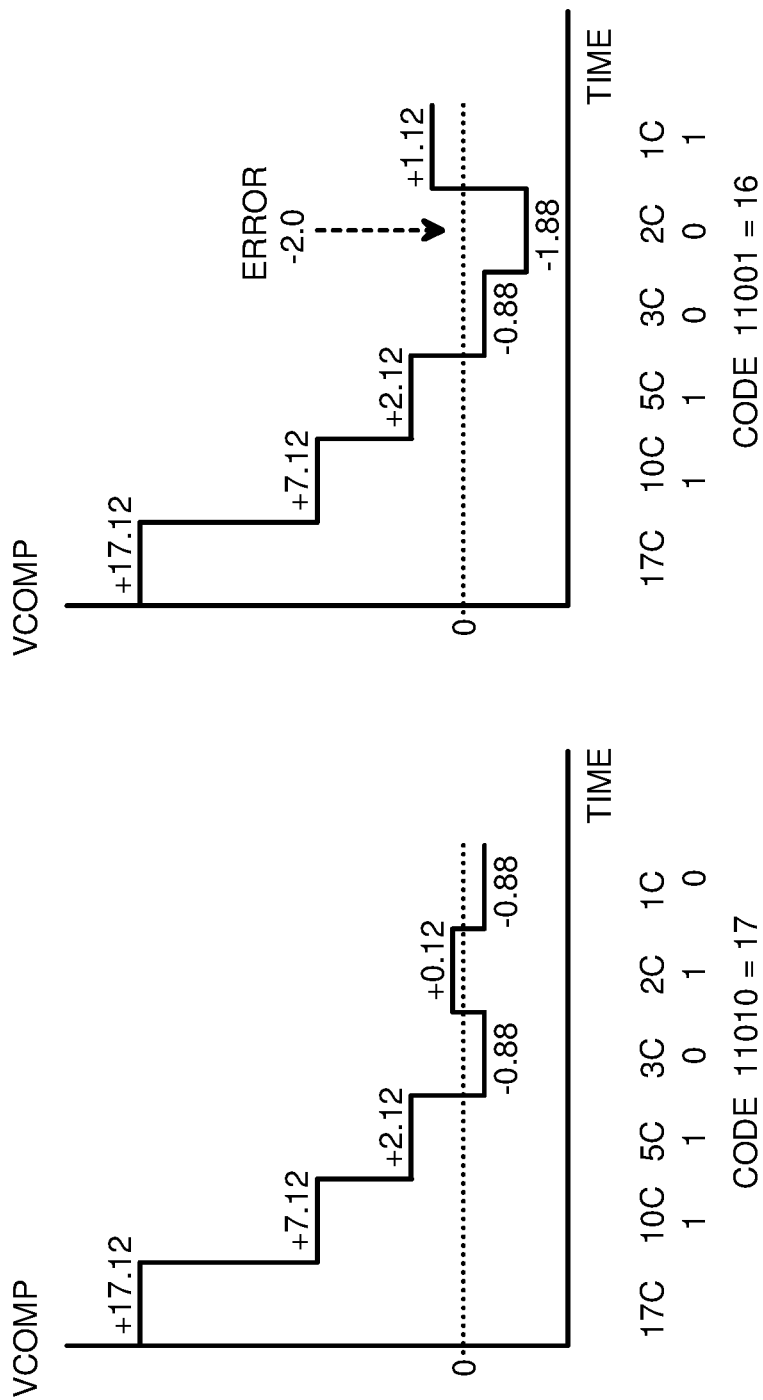
FIG. 2A shows a calibration sequence with little error.
FIG. 2B shows a calibration sequence with a significant error.
Figure 3:
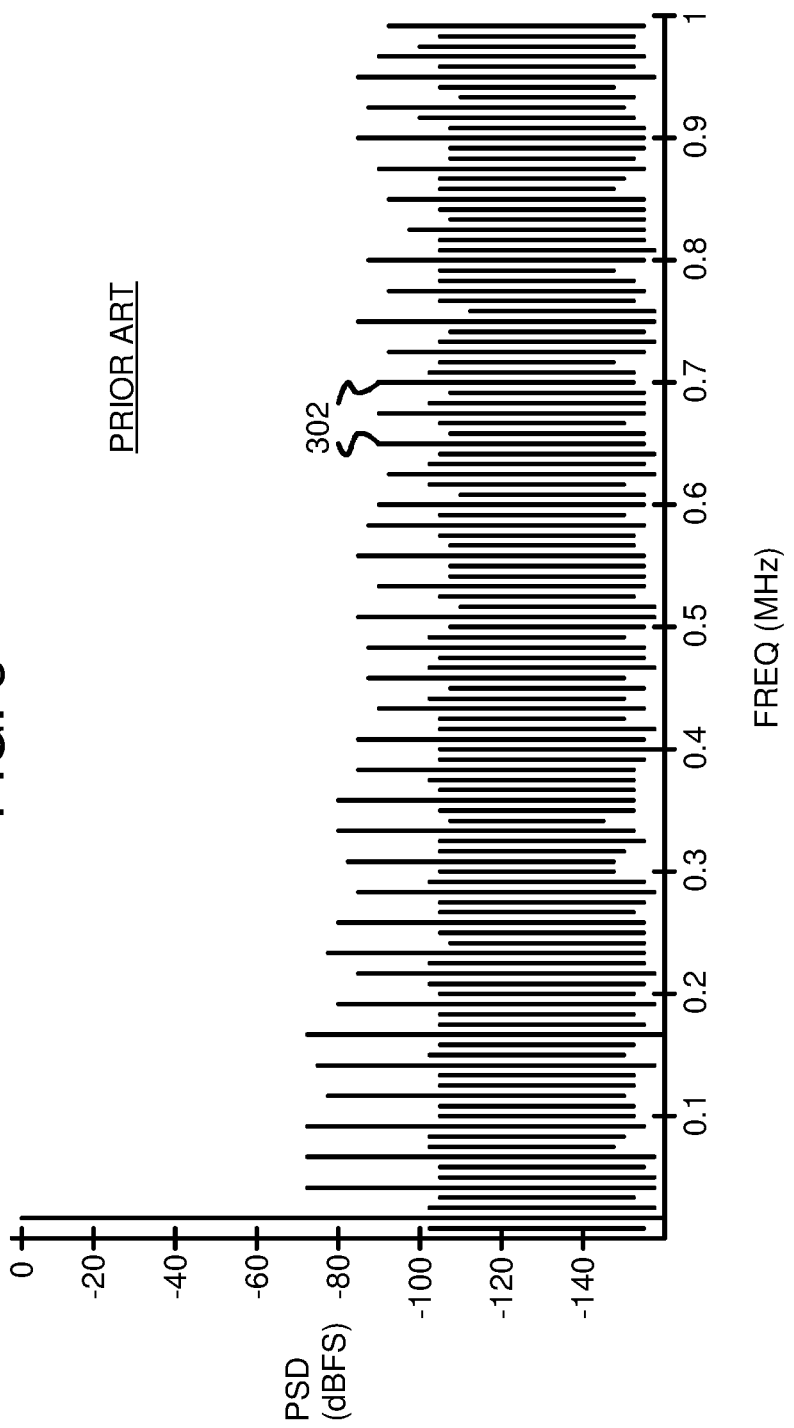
FIG. 3 is a plot of the spectral density of an ADC before calibration.

Capacitor sizes and radixes do not have to be integer ratios of each other, but could have fractional or decimal ratios. Capacitors 14-19 (FIG. 1) can be considered to be DAC elements, since they convert a digital signal (the SAR code from SAR 104) to an analog voltage (on the lines input to comparator 12). Other kinds of DAC elements may be substituted, such as resistors (such as in variable voltage dividers) or current sources. These DAC elements can be in series or in parallel or both, and can have binary weighted ratios or monotonically non-binary ratios, such as the 1, 1, 2, 3, 5, 10, 17, 32 sequence. Ratios may be integer or non-integer. The calibration routine may be modified for use with these alternative DAC elements, such as parallel current sources.

More sophisticated statistical methods could be combined with secondary calibration. For example, LSB averaging could be added. The SAR search can apply both binary and non-binary code.

While operations have been described in a serial manner for easier understanding, the Multi-Variable Stochastic Gradient Descent Method and the LMS Method for LUT Residual Errors may be performed in parallel or may be merged together during training. MSB 0 or 1 for DS[MSB] can be used to update the entries of XE1 or XE2. When MSB=0 (positive code DS[MSB] 0), all bit "1" entries of XE1 can be updated by one step size. The magnitude and polarity depend on w in a sense of negative feedback to minimize its error. Likewise for MSB=1 (i.e. DS[MSB]=1, negative code). All bit "0" entries of XE2 can be updated by one step size in a negative feedback manner. By doing this, w is converged to a minimum error and all entries XE1 and XE2 are converged a steady state value that minimize w after a long set of training data such as 200K length. Notice that this LMS process operates at the same time as the gradient descent method search of coefficients $\beta_0$, $\beta_1$, $\beta_2$, $\beta_3$, etc. All parameters are updated at the same time using a same set of 200K data point. A different number of data points may be substituted.

Comparator 12 can use many different circuit arrangements and may or may not have a latch on its output. For example, comparator 12 can be implemented by a gain amplifier as an alternative. A serial interface could be coupled to SAR 104 and an external processor used to execute routines to perform some or all of the functions of the calibration sequencer.

The ideal radixes R[X] could be pre-computed and stored in a read-only memory (ROM) and then copied to ideal radix LUT 111. A larger ROM or other memory to implement actual radix LUT 111 could have one entry for each possible value of the SAR code, such as 128 entries, with a pre-computed sum of all the 1 bits in the SAR code. Then an adder would not be needed, since the function of the adder is incorporated into the data stored in the LUT. Other such variations and data manipulations are possible. In particular, the DOS code added by digital adder 122 could be subtracted from the fully-expressed values in actual radix LUT 111 that has one entry for each possible value of SAR code SCA. The gain factor GF could likewise be incorporated into the values stored in actual radix LUT 111.

Data could be stored as two's-complement integers or floating point values in a variety of data formats. LUT+ 142 and LUT− 144 could store both the calibrated weights copied from LUT 111, and the non-linearity errors XE1, XE2 generated by secondary calibration, or could add XE1 or XE2 to the calibrated weights and store the updated weights. One copy of the calibrated weights could be stored for both LUT+ 142 and LUT− 144, and then XE1 stored for LUT+ 142 and XE2 stored for LUT− 144. LUT+142 and LUT− 144 could store error-adjusted weights just for MSB entries and ideal weights for LSB entries. LUT+ 142 and LUT− 144 could share the LSB entries and have separate MSB entries. LUT 111 could store the LSB entries for both LUT+ 142 and LUT− 144, while LUT+ 142 and LUT− 144 only store the MSB weights, or the MSB errors XE1 or XE2. Other storage options may be substituted.

Values may be shifted, transformed, or processed in a variety of ways. A single-ended or a fully differential ADC may be used. Equalizing switches could be added between true and complementary nodes for reset and equalization. Additional calibration hardware and routines may be added. ADC's or other logic may be interleaved, and sub-ADC/DAC's may be used or added. Other circuits using switched capacitors may incorporate the invention, such as a switched-capacitor programmable-gain residue amplifier.

The number of bits may be adjusted. For example, a 15 bit ADC could be used, or an 8-bit, 22-bit, or 18-bit. A different number of bits could be substituted for a different precision, and the number of bits could be fixed or could be variable.

Both differential and single-ended analog voltages may be converted. A single-ended analog voltage may be applied to one differential input, while a reference voltage is applied to the other differential input. A sample-and-hold block may be added that is a circuit, unit, or network of analog switches, capacitors, op amps, and various combinations. State machines, firmware, software, or hardware may be used to control sequencing such as the test digital values from calibration sequencer 108 or SAR 104.

Some embodiments may not use all components. For example, switches and buffers may be added or deleted in some embodiments. Different kinds of switches may be used, such as 2-way switches or 3-way switches. Muxes may be used as switches. Input resistors could be added to the analog input or to the inputs of comparator 12, or more complex input filters used. Multiple levels of switches may be used, such as 2-way switches for switches, and then an overall switch that connects either VREF or GND to these 2-way switches.

While binary-weighted conversion has been described, other weightings could be substituted, such as decimally-weighted, prime-weighted, or linearly-weighted, or octal-weighted. The digital value could be in these other number systems, such as octal numbers rather than binary numbers.

Inversions may be added by swapping inverting and non-inverting inputs as desired, but do not change the overall function and thus may be considered equivalents. The resistance and capacitance values may vary in different patterns. Capacitors, resistors, and other filter elements may be added. Switches could be n-channel transistors, p-channel transistors, or transmission gates with parallel n-channel and p-channel transistors, or more complex circuits, either passive or active, amplifying or non-amplifying.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation.

Inversions may be added, or extra buffering. The final sizes of transistors and capacitors may be selected after circuit simulation or field testing. Metal-mask options or other programmable components may be used to select the final capacitor, resistor, or transistor sizes. Capacitors may be connected together in parallel to create larger capacitors that have the same fringing or perimeter effects across several capacitor sizes.

The number of bit-positions that are considered to have ideal weights could vary or could even be programmable or user-selectable. Some of the MSB capacitors in a sub-sub array could be calibrated for higher-precision applications, while some the LSB capacitors in a sub array could be considered ideal and not calibrated in other lower-precision applications.

Other arrangements and grouping of adders and multipliers are possible. Other numbers of bits and capacitor arrangements can be substituted for ADC's of varying design accuracy.

References such as bandgap references may be used to generate VREF. While analog voltage sensing has been described, analog currents may be sensed rather than voltages by passing the analog current through a resistor to develop an analog voltage.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A dual-calibrated analog-digital converter comprising:
   an array of digital-analog elements each for converting a binary bit into an analog signal;
   wherein the digital-analog elements in the array have different sizes with size ratios that determine weights;
   a comparator that receives analog signals from the array of digital-analog elements to generate a compare result;
   a Successive-Approximation Register (SAR) for storing the binary bits that control the array of digital-analog elements;
   a controller that applies a SAR search sequence of the binary bits to the array of digital-analog elements and updates the binary bits in the SAR based on the compare result from the comparator;
   a summer for summing weights of digital-analog elements having a corresponding bit set in the SAR to generate a data code;
   a first Look-Up Table (LUT) having entries that store a weight for each size of the digital-analog elements, wherein the weight is an ideal weight for less-significant binary bits, and the weight is a calibrated weight for more-significant binary bits, wherein the ideal weight is a ratio of design sizes of the digital-analog elements, and the calibrated weight is the ideal weight adjusted for mis-match of effective sizes of the digital-analog elements;
   a first calibrator that operates the controller to apply a first calibration sequence of the binary bits to the array of digital-analog elements to measure relative effective sizes of the digital-analog elements to determine the calibrated weights, the first calibrator updating entries in the first LUT for the calibrated weights;
   a code complementor that receives the binary bits from the SAR and generates a complement code for the binary bits, the complement code including a sign bit that indicates when the complement code is positive and when the complement code is negative;
   a positive LUT having positive entries with the calibrated weights copied from the first LUT that are adjusted for first non-linearity error values determined by a second calibrator;
   a negative LUT having negative entries with the calibrated weights copied from the first LUT that are adjusted for second non-linearity error values determined by the second calibrator;
   a first summer for summing the positive entries from the positive LUT for digital-analog elements having a corresponding bit set in the complement code, the first summer also adding a first offset to generate a corrected code on a corrected output when the sign bit indicates that the complement code is positive; and
   a second summer for summing the negative entries from the negative LUT for digital-analog elements having a corresponding bit cleared to zero in the complement code, the second summer also adding a second offset to generate the corrected code on the corrected output when the sign bit indicates that the complement code is negative;
   whereby the corrected output is generated from the positive LUT when the sign bit of the complement code is positive, and the corrected output is generated from the negative LUT when the sign bit of the complement code is negative.

2. The dual-calibrated analog-digital converter of claim 1 wherein the first non-linearity error values are not exactly equal to the second non-linearity error values;
   wherein the positive entry in the positive LUT and the negative entry in the negative LUT for a corresponding digital-analog element are not equal while having no more than a difference of 10%;
   wherein corresponding entries in the positive LUT and in the negative LUT indicate error-corrected and calibrated weights that are within 10% of each other.

3. The dual-calibrated analog-digital converter of claim 1 further comprising:
   the second calibrator that generates the first non-linearity error values by executing a Least Mean-Square (LMS) routine on the positive entries to converge on the first non-linearity error values, the second calibrator also generating the second non-linearity error values by executing the Least Mean-Square (LMS) routine on the negative entries to converge on the second non-linearity error values.

4. The dual-calibrated analog-digital converter of claim 3 further comprising:
   an initial loader that loads entries in the first LUT with the ideal weights for the digital-analog elements before the first calibrator generates the calibrated weights and updates the entries in the first LUT with the calibrated weights;
   a positive initial loader that reads the calibrated weights from the first LUT and loads the positive entries in the positive LUT with the calibrated weights before the second calibrator generates the first non-linearity error values and adjusts the positive entries for the first non-linearity error values;
   a negative initial loader that reads the calibrated weights from the first LUT and loads the negative entries in the negative LUT with the calibrated weights before the second calibrator generates the second non-linearity error values and adjusts the negative entries for the second non-linearity error values.

5. The dual-calibrated analog-digital converter of claim 1 further comprising:

a multiply-adder that receives polynomial coefficients and receives the corrected code, the multiply-adder multiplying a first-order polynomial coefficient with the corrected code to generate a first term, multiplying a second-order polynomial coefficient with a square of the corrected code to generate a second term, multiplying a third-order polynomial coefficient with a cube of the corrected code to generate a third term, and summing the first term, the second term, and the third term to generate a polynomial corrected code, whereby the polynomial coefficients further correct for non-linearity errors.

6. The dual-calibrated analog-digital converter of claim 5 wherein the second calibrator further comprises a polynomial coefficients generator that minimizes non-linearity errors in the binary bits from the SAR using a Multi-Variable Stochastic Gradient Descent process to converge on the polynomial coefficients.

7. A self-calibrating mixed-signal converter comprising:
an array of digital-analog elements, each for converting a binary bit to an analog signal;
a comparator that compares two analog inputs to generate a compare result;
a Least-Significant-Bit (LSB) digital-analog element in the array of digital-analog elements, the LSB digital-analog element having a smallest effect on the two analog inputs, the LSB digital-analog element having an ideal radix of one;
wherein other digital-analog elements in the array of digital-analog elements each have an ideal radix that is a function of a ratio of a design size of a digital-analog element to the design size of the LSB digital-analog element;
wherein the array of digital-analog elements comprise at least five digital-analog elements with different design sizes and having at least five different values of the ideal radix;
wherein the array of digital-analog elements is connected to at least one of the two analog inputs to the comparator wherein each of the at least five digital-analog elements with different design sizes cause at least five different values of an effect on at least one of the two analog inputs to the comparator;
wherein manufactured sizes of the digital-analog elements differ from the design sizes by an error amount;
a Successive-Approximation Register (SAR) that applies a SAR search sequence of binary bits to a portion of the array of digital-analog elements having an ideal radix less than a target ideal radix of a target digital-analog element in the array of digital-analog elements;
wherein bits are set or cleared in the SAR during the SAR search sequence in response to the compare result from the comparator to generate a final SAR value when the SAR search sequence is completed;
a summer for summing the ideal radixes for digital-analog elements having a corresponding bit set in the final SAR value to generate a target measured radix;
a first Look-Up Table (LUT) that stores the target measured radix from the summer for the target digital-analog element, the first LUT also storing the ideal radixes for the portion of the array of digital-analog elements having the ideal radix that is less than the target ideal radix of the target digital-analog element, and stores target measured radixes for other digital-analog elements having an ideal radix greater than the target ideal radix;

a code complementor that receives the binary bits from the SAR and generates a complement code for the binary bits, the complement code including a sign bit that indicates when the complement code is positive and when the complement code is negative;
a positive LUT having positive entries copied from the first LUT and adjusted for first non-linearity errors determined by a secondary calibration routine;
a negative LUT having negative entries copied from the first LUT and adjusted for second non-linearity errors determined by the secondary calibration routine;
a first summer for summing the positive entries in the positive LUT for digital-analog elements having a corresponding bit set in the complement code, the first summer also adding a first offset to generate a corrected output when the sign bit indicates that the complement code is positive; and
a second summer for summing the negative entries in the negative LUT for digital-analog elements having a corresponding bit cleared to zero in the complement code, the second summer also adding a second offset and negating a sum to generate the corrected output when the sign bit indicates that the complement code is negative;
whereby the corrected output is generated from the positive LUT when the sign bit of the complement code is positive, and the corrected output is generated from the negative LUT when the sign bit of the complement code is negative.

8. The self-calibrating mixed-signal converter of claim 7 further comprising:
a multiply-adder that receives polynomial coefficients and receives the corrected output, the multiply-adder multiplying a first-order polynomial coefficient with the corrected output to generate a first term, multiplying a second-order polynomial coefficient with a square of the corrected output to generate a second term, multiplying a third-order polynomial coefficient with a cube of the corrected output to generate a third term, and summing the first term, the second term, and the third term to generate a polynomial corrected output,
whereby the polynomial coefficients further correct for non-linearity errors.

9. The self-calibrating mixed-signal converter of claim 8 further comprising:
a normalizer that normalizes the corrected output by dividing by a sum of all the entries in the positive LUT when the sign bit is positive, and by dividing by a sum of all the entries in the negative LUT when the sign bit is negative.

10. The self-calibrating mixed-signal converter of claim 9 wherein the secondary calibration routine comprises:
a computer-implemented Least Mean-Square (LMS) Method to generate LUT Residual Errors to generate the first non-linearity errors for adjusting the entries in the positive LUT, and to generate the second non-linearity errors for adjusting the entries in the negative LUT.

11. The self-calibrating mixed-signal converter of claim 10 wherein the secondary calibration routine further comprises:
a computer-implemented Multi-Variable Stochastic Gradient Descent Method that generates the polynomial coefficients including the first-order polynomial coefficient, the second-order polynomial coefficient, and the third-order polynomial coefficient, wherein the secondary calibration routine generates the polynomial coefficients to adjust for non-linearity errors.

12. An Analog-Digital converter comprising:
an array of digital-analog elements, each for converting a binary bit to an analog signal;
a comparator that compares an analog comparator input coupled to the array to generate a compare result;
a Successive-Approximation Register (SAR) that applies a SAR search sequence of binary bits to the array of digital-analog elements;
wherein the binary bits are set or cleared in the SAR during the SAR search sequence in response to the compare result from the comparator to generate a final SAR value when the SAR search sequence is completed;
a code complementor that generates a complement code from the binary bits from the SAR, the complement code having a sign bit;
a positive Look-Up Table (LUT) that stores positive entries that correspond to a plurality of calibrated sizes of the digital-analog elements in the array, wherein the positive entries are adjusted by first error values;
a negative LUT that stores negative entries that correspond to the plurality of calibrated sizes of the digital-analog elements in the array, wherein the negative entries are adjusted by second error values; and
a summer that generates a corrected code by summing the positive entries having a corresponding bit set in the complement code and adding a first offset and dividing by a sum of all the positive entries when the sign bit indicates a positive complement code;
wherein the summer further generates the corrected code by summing the negative entries having a corresponding bit cleared in the complement code and adding a second offset and dividing by a sum of all the negative entries when the sign bit indicates a negative complement code.

13. The Analog-Digital converter of claim 12 wherein the code complementor generates the complement code by performing a successive approximation search on the binary bits.

14. The Analog-Digital converter of claim 12 further comprising:
a primary calibrator that generates the plurality of calibrated sizes of the digital-analog elements in the array by operating the SAR to perform a primary calibration routine to measure calibrated sizes of a plurality of larger-size digital-analog elements in the array;
a secondary calibrator that generates the first error values by executing a Least Mean-Square (LMS) routine on the positive entries to converge on the first error values, the secondary calibrator also generating the second error values by executing the Least Mean-Square (LMS) routine on the negative entries to converge on the second error values.

15. The Analog-Digital converter of claim 14 further comprising:

a multiply-adder that receives polynomial coefficients and receives the corrected code from the summer, the multiply-adder multiplying a first-order polynomial coefficient with the corrected code to generate a first term, multiplying a second-order polynomial coefficient with a square of the corrected code to generate a second term, multiplying a third-order polynomial coefficient with a cube of the corrected code to generate a third term, and summing the first term, the second term, and the third term to generate a polynomial corrected code,
whereby the polynomial coefficients further correct for non-linearity errors.

16. The Analog-Digital converter of claim 15 wherein the secondary calibrator further comprises:
a polynomial coefficients generator that minimizes non-linearity errors in the binary bits from the SAR using a Multi-Variable Stochastic Gradient Descent process to converge on the polynomial coefficients.

17. The Analog-Digital converter of claim 14 further comprising:
a digital filter for digitally filtering the binary bits from the SAR for a range of actual values to generate a range of reference values;
generating non-linearity errors for input to the secondary calibrator by generating a difference of the reference values and the actual values and squaring the difference.

18. The Analog-Digital converter of claim 14 further comprising:
a reference Analog-Digital converter, identical to the Analog-Digital converter, for generating a second set of binary bits from a second SAR;
a digital reference processor for generating non-linearity errors for input to the secondary calibrator by generating a difference of the second set of binary bits with the binary bits and squaring the difference.

19. The Analog-Digital converter of claim 14 wherein the array of digital-analog elements further comprises:
a capacitor array, each capacitor in the capacitor array having one terminal connected to a first analog input to the comparator, each capacitor having a second terminal that receives voltages that are selectively connected to the capacitor by a binary bit in the SAR search sequence;
wherein the voltages include an analog input signal to be converted to a digital signal by the Analog-Digital converter;
wherein the Analog-Digital converter is an Analog-to-Digital Converter (ADC).

20. The Analog-Digital converter of claim 14 wherein the array of digital-analog elements further comprises:
a plurality of current sources that are connected in parallel;
wherein the Analog-Digital converter is a Digital-to-Analog Converter (DAC).

* * * * *